(12) United States Patent
Hirai et al.

(10) Patent No.: US 9,144,970 B2
(45) Date of Patent: Sep. 29, 2015

(54) LIQUID EJECTING HEAD, LIQUID EJECTING APPARATUS, PIEZOELECTRIC ELEMENT, AND METHOD FOR MANUFACTURING PIEZOELECTRIC ELEMENT

(71) Applicant: Seiko Epson Corporation, Tokyo (JP)

(72) Inventors: Eiju Hirai, Okaya (JP); Sayaka Kimura, Suwa (JP)

(73) Assignee: Seiko Epson Corporatio (JP)

( * ) Notice: Subject to any disclaimer, the term of this patent is extended or adjusted under 35 U.S.C. 154(b) by 0 days.

(21) Appl. No.: 14/101,706

(22) Filed: Dec. 10, 2013

(65) Prior Publication Data
US 2014/0176646 A1    Jun. 26, 2014

(30) Foreign Application Priority Data
Dec. 20, 2012  (JP) .................. 2012-277758

(51) Int. Cl.
| | | |
|---|---|---|
| *B41J 2/045* | (2006.01) | |
| *B41J 2/14* | (2006.01) | |
| *H01L 41/047* | (2006.01) | |
| *H01L 41/09* | (2006.01) | |
| *H01L 41/29* | (2013.01) | |
| *H01L 41/332* | (2013.01) | |
| *H01L 41/314* | (2013.01) | |

(52) U.S. Cl.
CPC .......... *B41J 2/14201* (2013.01); *B41J 2/14233* (2013.01); *H01L 41/047* (2013.01); *H01L 41/0973* (2013.01); *H01L 41/29* (2013.01); *H01L 41/332* (2013.01); *H01L 41/314* (2013.01); *Y10T 29/42* (2015.01)

(58) Field of Classification Search
CPC .... B41J 2/14233; B41J 2/14201; B41J 2/161; B41J 2/1623; B41J 2/1646
See application file for complete search history.

(56) References Cited

U.S. PATENT DOCUMENTS

| | | | |
|---|---|---|---|
| 7,891,783 B2 * | 2/2011 | Tsuda .......................... | 347/70 |
| 2009/0219345 A1 | 9/2009 | Yazaki et al. | |
| 2009/0284568 A1 | 11/2009 | Yazaki | |
| 2012/0056944 A1 * | 3/2012 | Shimada ....................... | 347/68 |

FOREIGN PATENT DOCUMENTS

| | | |
|---|---|---|
| JP | 2008-114370 A | 5/2008 |
| JP | 2009-172878 A | 8/2009 |
| JP | 2009-196329 A | 9/2009 |

* cited by examiner

*Primary Examiner* — Lisa M Solomon
(74) *Attorney, Agent, or Firm* — Harness, Dickey & Pierce, P.L.C.

(57) ABSTRACT

A flow channel substrate has pressure chambers, and the pressure chambers communicate with nozzle openings for ejecting liquid. Each of piezoelectric elements on the flow channel substrate has a piezoelectric layer, a pair of electrodes, and a wiring layer coupled to the electrodes. The wiring layer has an adhesion layer and a conductive layer on the adhesion layer. The adhesion layer contains at least one selected from nickel, chromium, titanium, and tungsten. The piezoelectric element has an insulating film at least between the wiring layer and the electrodes. The wiring layer and the electrodes of the piezoelectric element are coupled via contact holes created through the insulating film.

9 Claims, 12 Drawing Sheets

LIQUID EJECTING HEAD, LIQUID EJECTING APPARATUS, PIEZOELECTRIC ELEMENT, AND METHOD FOR MANUFACTURING PIEZOELECTRIC ELEMENT

BACKGROUND

1. Technical Field

The present invention relates to a liquid ejecting head that ejects liquid through nozzle openings, a liquid ejecting apparatus that has a liquid ejecting head, a piezoelectric element for liquid ejecting heads or similar devices, and a method for manufacturing a piezoelectric element.

2. Related Art

A known liquid ejecting head ejects droplets of liquid through its nozzle openings by deforming piezoelectric elements (piezoelectric actuators) to change the pressure in the liquid in pressure chambers that communicate with the nozzle openings. A representative example of a liquid ejecting head is an ink jet recording head, which ejects droplets of ink.

A typical ink jet recording head has a flow channel substrate, and also has pressure chambers and piezoelectric elements on either side of the flow channel substrate. The pressure chambers communicate with nozzle openings. The piezoelectric elements operate to deform diaphragms and change the pressure in the ink filled in the pressure chambers. As a result, droplets of the ink are ejected through the nozzle openings.

In a typical structure, each piezoelectric element has a first electrode, a piezoelectric layer, and a second electrode all placed on a diaphragm, and the first electrode and the second electrode are coupled to a wiring layer for coupling with wiring that leads to a driving IC and other components (e.g., see JP-A-2008-114370, JP-A-2009-172878, and JP-A-2009-196329).

When the wiring layer has an adhesion layer made of nickel-chromium or a similar material, patterning the adhesion layer by wet etching causes electrochemical corrosion to occur at the boundaries between the adhesion layer and the electrodes because the wet etching process uses an acid as etchant. This sort of damage may lead to events such as detachment of the electrodes or the wiring layer.

Such problems are not unique to ink jet recording heads. Similar problems may also be encountered with liquid ejecting heads used with any kind of liquid other than ink. Besides piezoelectric elements for liquid ejecting heads, piezoelectric elements for other devices may also have similar problems.

SUMMARY

An advantage of some aspects of the invention is that they provide a liquid ejecting head, a liquid ejecting apparatus, and a piezoelectric element that are all advantageous in that the electrodes and the wiring layer used in them are less likely to detach. An advantage of some other aspects of the invention is that they provide a method for manufacturing such a piezoelectric element.

An aspect of the invention provides a liquid ejecting head that has a flow channel substrate and a piezoelectric element. The flow channel substrate has a pressure chamber that communicates with a nozzle opening for ejecting liquid. The piezoelectric element is provided to the flow channel substrate and has a piezoelectric layer, a pair of electrodes, and a wiring layer coupled to the electrodes. The wiring layer has an adhesion layer and a conductive layer on the adhesion layer. The adhesion layer contains at least one selected from nickel, chromium, titanium, and tungsten. The piezoelectric element has an insulating film at least between the wiring layer and the electrodes. The wiring layer and each of the electrodes of the piezoelectric element are coupled via a contact hole created through the insulating film.

In this aspect the insulating film protects the electrodes and limits the electrochemical corrosion that occurs between the adhesion layer and the electrodes while the wiring layer is wet-etched using an acidic etchant. As a result, the electrodes and the wiring layer are unlikely to detach.

Preferably, the pair of electrodes are a first electrode on the flow channel substrate side and a second electrode opposite the flow channel substrate with respect to the piezoelectric layer. This provides high precision in forming the piezoelectric element on the flow channel substrate by film formation and lithography.

It is also preferred that the second electrode has a first layer on the piezoelectric layer side and a second layer on the side opposite the first layer first and that the insulating film and the second layer have been simultaneously patterned. Forming the first layer and then patterning the piezoelectric layer with it protects the surface of the piezoelectric layer from any damage caused by the application and removal of a resist involved in the patterning process. Such a configuration also allows the piezoelectric layer to be heated after the first layer is formed (post-annealing). Post-annealing improves the piezoelectric properties of the piezoelectric layer. Furthermore, simultaneously patterning the insulating film and the second layer requires fewer etching processes than patterning them separately, thereby reducing costs.

The insulating film may be made of titanium oxide.

Another aspect of the invention provides a liquid ejecting apparatus that has a liquid ejecting head according to the preceding aspect.

A liquid ejecting apparatus according to this aspect is highly reliable because the electrodes and the wiring in the liquid ejecting head are unlikely to detach.

A different aspect of the invention provides a piezoelectric element that has a piezoelectric layer, a pair of electrodes, and a wiring layer coupled to the electrodes. The wiring layer has an adhesion layer and a conductive layer on the adhesion layer. The adhesion layer contains at least one selected from nickel, chromium, titanium, and tungsten. The piezoelectric element has an insulating film at least between the wiring layer and the electrodes. The wiring layer and each of the electrodes are coupled via a contact hole created through the insulating film.

In this aspect the insulating film protects the electrodes and limits the electrochemical corrosion that occurs between the adhesion layer and the electrodes while the wiring layer is wet-etched using an acidic etchant. As a result, the wiring layer is unlikely to detach.

Another aspect of the invention provides a method for manufacturing a piezoelectric element that has a piezoelectric layer, a pair of electrodes, and a wiring layer coupled to the electrodes. A method according to this aspect includes the following: with the electrodes exposed, forming an insulating film that protects the electrodes at least in the region where the wiring layer is to be formed, and creating contact holes through the insulating film; forming an adhesion layer (containing at least one selected from nickel, chromium, titanium, and tungsten) on the insulating film and on the electrodes in the contact holes; forming the wiring layer by depositing a conductive layer on the adhesion layer; and patterning the wiring layer by wet-etching at least the adhesion layer.

In this aspect the insulating film protects the electrodes and limits the electrochemical corrosion that occurs between the adhesion layer and the electrodes while the wiring layer is wet-etched using an acidic etchant. As a result, the wiring layer is unlikely to detach.

Preferably, the pair of electrodes are a first electrode on either side of the piezoelectric layer and a second electrode on the other side of the piezoelectric layer, opposite the first electrode, the second electrode has a first layer on the piezoelectric layer side and a second layer opposite the piezoelectric layer with respect to the first layer, and the insulating film is formed over the second layer and then patterned simultaneously with the second layer. Forming the first layer first and then patterning the piezoelectric layer with it protects the surface of the piezoelectric layer from any damage caused by the application and removal of a resist involved in the patterning process. Such a configuration also allows the piezoelectric layer to be heated after the first layer is formed (post-annealing). Post-annealing improves the piezoelectric properties of the piezoelectric layer. Furthermore, simultaneously patterning the insulating film and the second layer requires fewer etching processes than patterning them separately, thereby reducing costs.

It is also preferred that the insulating film is formed by depositing a layer of titanium over the second layer, patterning the second layer and the layer of titanium by etching these layers through a resist mask, and removing the resist mask by ashing in such a way that the layer of titanium is oxidized and forms a layer of titanium oxide. This is an easy way to obtain an insulating film made of titanium oxide.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following details some embodiments of the invention with reference to the accompanying drawings.

Embodiment 1

Figure 1:
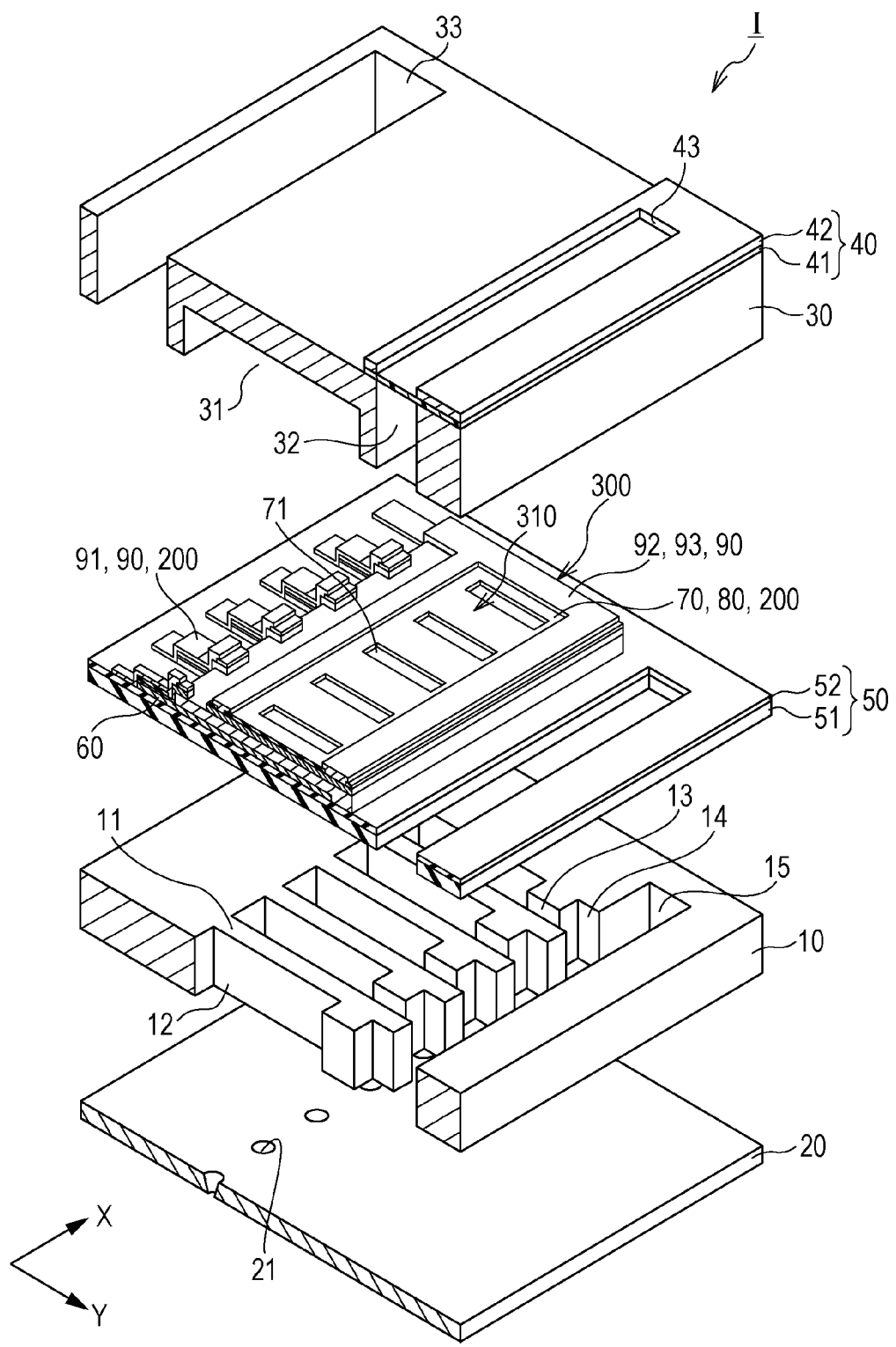
FIG. 1 is an exploded perspective view of a recording head according to Embodiment 1 of the invention.
Figure 2:
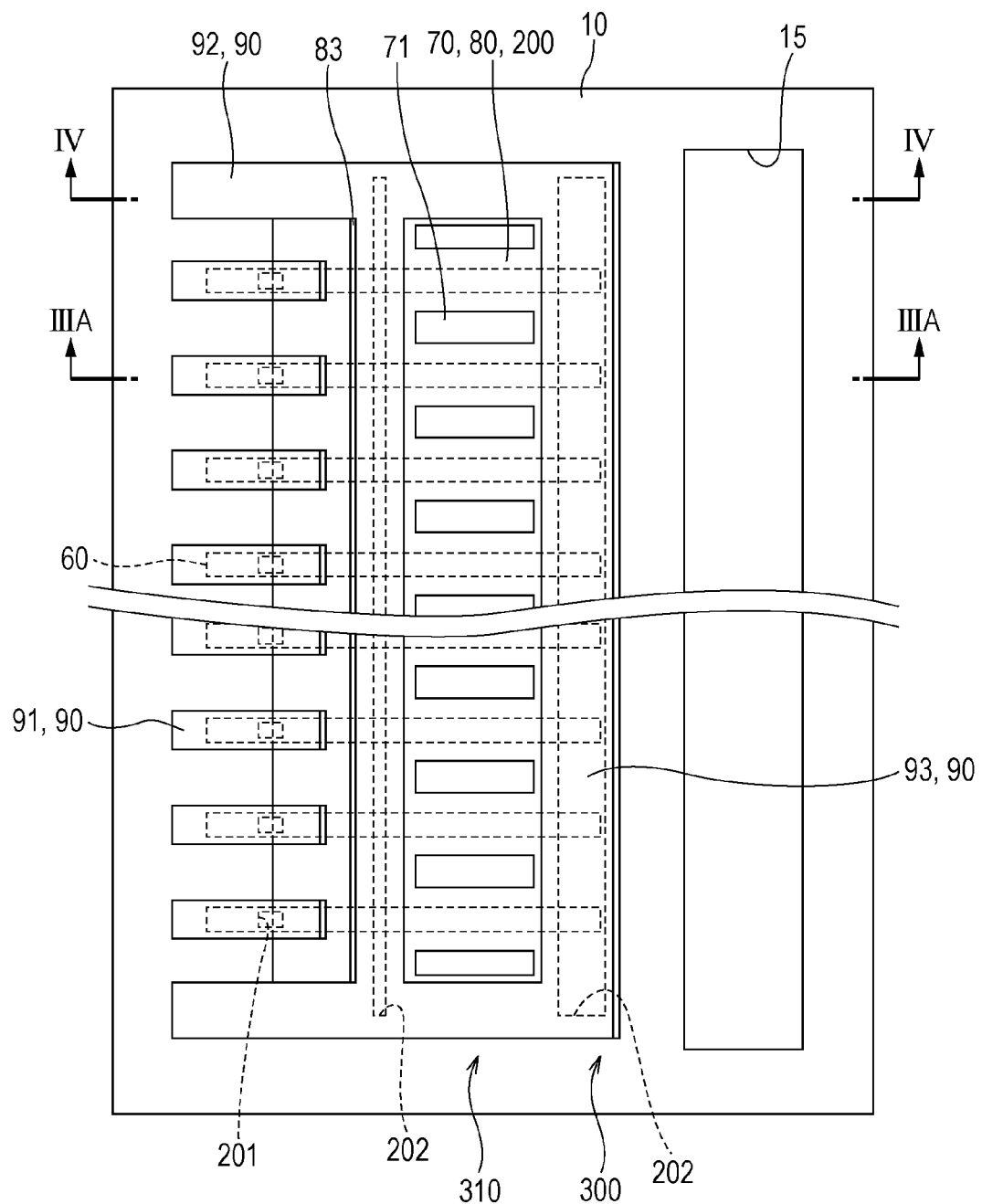
FIG. 2 is a plan view of the flow channel substrate used in the recording head according to Embodiment 1 of the invention.
Figure 3A:
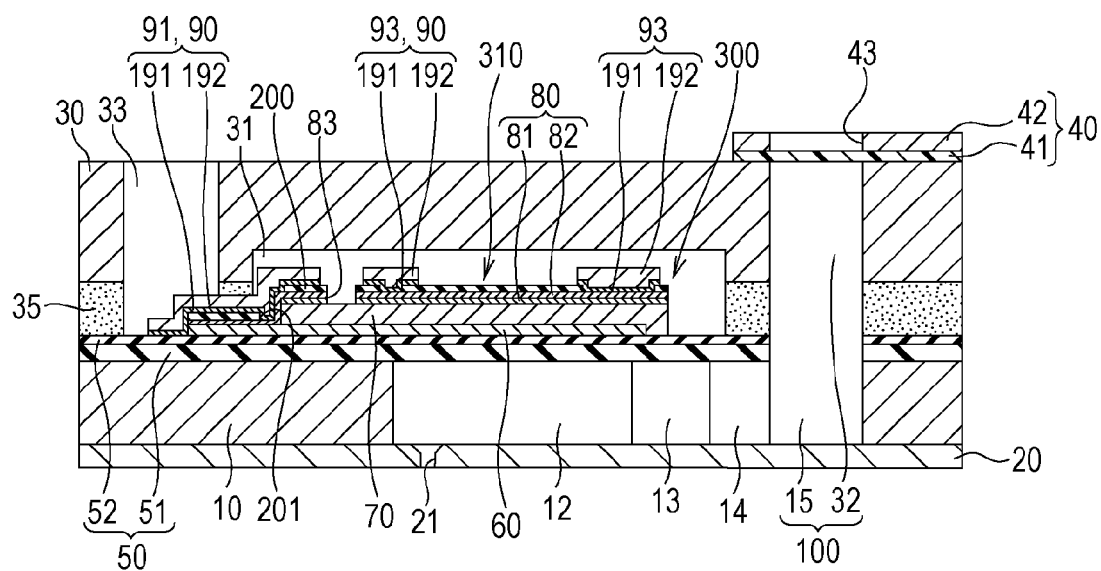
FIGS. 3A and 3B are a cross-sectional view and an enlarged cross-sectional view, respectively, of the recording head according to Embodiment 1 of the invention.
Figure 3B:
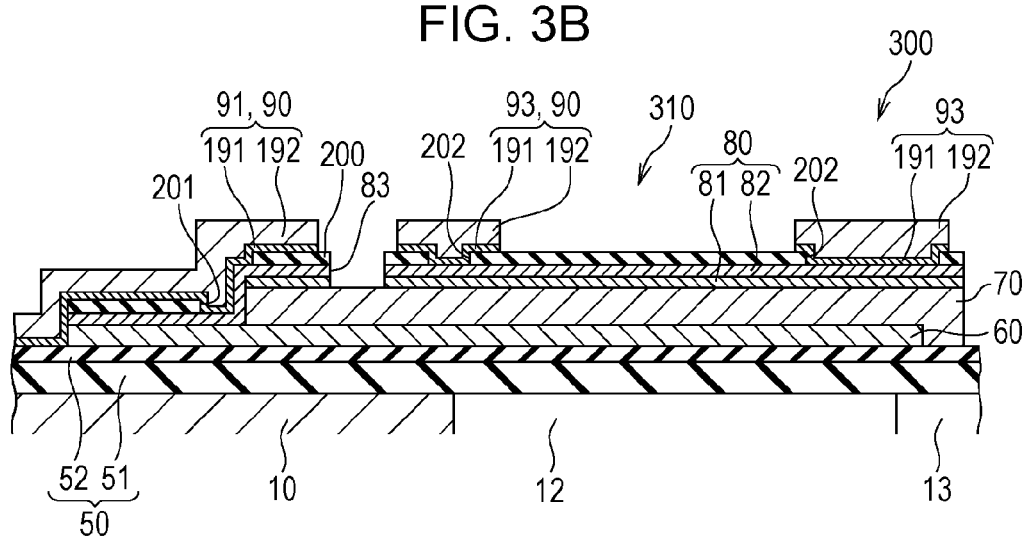
Figure 4:
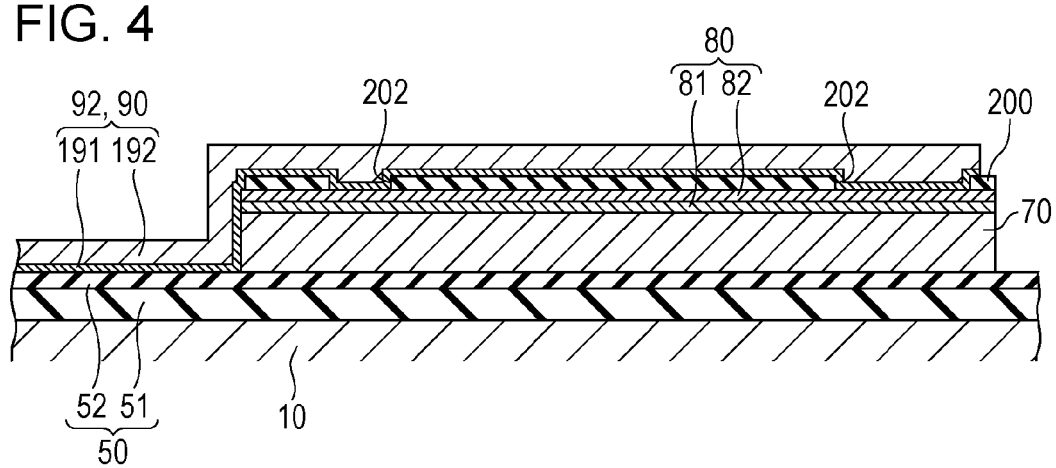
FIG. 4 is an enlarged cross-sectional view of some essential components of the recording head according to Embodiment 1 of the invention.

FIG. 1 is a perspective view of an ink jet recording head as an example of a liquid ejecting head according to Embodiment 1 of the invention. FIG. 2 is a plan view of the flow channel substrate used in the recording head. FIG. 3A is a cross-sectional view taken along line IIIA-IIIA in FIG. 2, and FIG. 3B is an enlarged view of FIG. 3A. FIG. 4 is a cross-sectional view taken along line IV-IV in FIG. 2.

As illustrated in these drawings, the ink jet recording head I, an example of a liquid ejecting head according to this embodiment, has a flow channel substrate 10 that has pressure chambers 12. Defined by several walls 11, the pressure chambers 12 are arranged in the direction of the arrangement of several nozzle openings 21 for ejecting ink of the same color. This direction is hereinafter referred to as the direction of arrangement of the pressure chambers 12 or first direction X. The direction perpendicular to first direction X is hereinafter referred to as second direction Y.

The flow channel substrate 10 also has ink supply paths 13 and communicating paths 14 both defined by the walls 11. These components are located next to either longitudinal end of the pressure chambers 12, or in other words next to either end in second direction Y, the direction perpendicular to first direction X. The substrate also has a communicating space 15 as a component of a manifold 100, which serves as a common ink tank (liquid tank) for the pressure chambers 12, in the outside of the communicating paths 14 (opposite the pressure chambers 12 in second direction Y). The flow channel substrate 10 therefore has a flow channel formed by the pressure chambers 12, the ink supply paths 13, the communicating paths 14, and the communicating space 15.

A nozzle plate 20 drilled with nozzle openings 21 that communicate with the pressure chambers 12 is bonded using an adhesive agent, hot-melt film, or a similar material to either side of the flow channel substrate 10, or more specifically to the side on which the flow channel formed by the pressure chambers 12 and other components has openings. This means that the nozzle plate 20 has nozzle openings 21 arranged in first direction X.

A diaphragm 50 is provided on the other side of the flow channel substrate 10. The diaphragm 50 in this embodiment is composed of an elastic film 51 on the flow channel substrate 10 and an insulating film 52 on the elastic film 51. The pressure chambers 12 and the other flow channel components are created by anisotropically etching the flow channel substrate 10 from either side, and the diaphragm 50 (elastic film 51) is on the other side of the pressure chambers 12 and the other flow channel components.

Piezoelectric elements 300 are formed on the insulating film 52 and each have a first electrode 60, a piezoelectric layer 70, and a second electrode 80. The thickness of these layers is, for example, about 0.2 µm, about 1.0 µm, and about 0.05 µm, respectively. Each piezoelectric element 300 on the substrate (flow channel substrate 10) serves as an actuator in this embodiment.

The following describes the piezoelectric elements 300 as actuators in more detail with reference to FIGS. 3A and 3B and FIG. 4.

As illustrated in these drawings, the first electrode 60, a component of the piezoelectric elements 300, is cut into pieces for the individual pressure chambers 12 and provides separate electrodes for active sections (described hereinafter). Each piece of the first electrode (hereinafter simply referred to as the first electrode 60) is narrower than the pressure chamber 12 in the first direction X of the pressure chamber 12. In other words, the ends of the first electrode 60 in the first direction X of the pressure chamber 12 are within the area facing the pressure chamber 12. On the other hand, the ends of the first electrode 60 in second direction Y are both beyond the edge of the pressure chamber 12. The entire first electrode should be made of a material that is not oxidized and maintains conductivity while the piezoelectric layer 70 (described hereinafter) is formed. Examples of suitable materials include noble metals such as platinum (Pt) and iridium (Ir), and conductive oxides such as lanthanum nickel oxide (LNO). The first electrode 60 may have an adhesion layer that allows the layer of conductive material to be firmly attached to the diaphragm 50. Although not illustrated, this embodiment uses an adhesion layer made of titanium. Other examples of materials that can be used to make such an adhesion layer include zirconium, titanium, and titanium oxide. The first electrode 60 in this embodiment therefore has an adhesion layer made of titanium and a conductive layer made of at least one selected from such conductive materials as those listed above.

The piezoelectric layer 70 continuously extends in first direction X and has a predetermined width in second direction Y. The width of the piezoelectric layer 70 in second direction Y is larger than the length of the pressure chamber 12 in second direction Y. This means that the piezoelectric layer 70 extends beyond the edge of the pressure chamber 12 in the second direction Y of the pressure chamber 12.

The end of the piezoelectric layer 70 on the ink supply path side in the second direction Y of the pressure chamber 12 is beyond the edge of the first electrode 60; the piezoelectric layer 70 covers the first electrode 60 at this end. The end of the piezoelectric layer 70 on the nozzle opening 21 side is within the edge of the first electrode 60 (i.e., closer to the pressure chamber 12); the piezoelectric layer 70 does not cover the first electrode 60 at its end on the nozzle opening 21 side.

The piezoelectric layer 70 is a perovskite-structured crystal film (perovskite crystals) that is formed on the first electrode 60, made of a ferroelectric ceramic material, and can serve as an electromechanical transducer. Examples of materials that can be used to make the piezoelectric layer 70 include ferroelectric piezoelectric materials such as lead zirconate titanate (PZT) and their derivatives containing metal oxides such as niobium oxide, nickel oxide, and magnesium oxide. Specific examples include lead titanate ($PbTiO_3$), lead zirconate titanate ($Pb(Zr, Ti)O_3$), lead zirconate ($PbZrO_3$), lead lanthanum zirconate ((Pb, La)$TiO_3$), lead lanthanum zirconate titanate ((Pb, La)(Zr, Ti)$O_3$), and lead zirconium titanate magnesium niobate (Pb(Zr, Ti)(Mg, Nb)$O_3$). The piezoelectric layer 70 in this embodiment is made of lead zirconate titanate (PZT).

Besides piezoelectric materials containing lead (lead-based piezoelectrics), piezoelectric materials that contain no lead (lead-free piezoelectrics) can also be used to make the piezoelectric layer 70. Examples of lead-free piezoelectrics include the following: bismuth ferrite ($BiFeO_3$, abbreviated to BFO), barium titanate ($BaTiO_3$, BT), sodium potassium niobate ((K, Na)$NbO_3$, KNN), potassium sodium lithium niobate ((K, Na, Li)$NbO_3$), potassium sodium lithium niobate tantalate ((K, Na, Li) (Nb, Ta)$O_3$), bismuth potassium titanate (($Bi_{1/2}K_{1/2}$)$TiO_3$, BKT), bismuth sodium titanate (($Bi_{1/2}Na_{1/2}$)$TiO_3$, BNT), and bismuth manganite ($BiMnO_3$, BM); perovskite composite oxides containing bismuth, potassium, titanium, and iron (x[($Bi_xK_{1-x}$)$TiO_3$]-(1−x)[$BiFeO_3$], BKT-BF); and perovskite composite oxides containing bismuth, iron, barium, and titanium ((1−x)[$BiFeO_3$]-x[$BaTiO_3$], BFO-BT) and their derivatives further containing metals such as manganese, cobalt, and chromium ((1−x) [Bi($Fe_{1-y}M_y$)$O_3$]-x [$BaTiO_3$], M: Mn, Co, Cr, or a similar metal).

As is described in more detail hereinafter, various methods can be used to form the piezoelectric layer 70, including liquid-phase techniques such as the sol-gel process and MOD (metal-organic decomposition), and also PVD (physical vapor deposition) techniques (gas-phase processes) such as sputtering and laser abrasion.

Such a piezoelectric layer 70 also has depressions corresponding to the walls 11. The width of each depression 71 in first direction X is substantially equal to or larger than the width of each wall 11 in first direction X. This ensures moderate rigidity of the diaphragm 50 in the portions facing the ends of the pressure chambers 12 in second direction Y (the "arms" of the diaphragm 50), thereby allowing the piezoelectric elements 300 to be smoothly displaced.

The second electrode 80 is on the side opposite the first electrode 60 with respect to the piezoelectric layer and serves as a common electrode for several active sections 310. The second electrode 80 in this embodiment has a first layer 81 on the piezoelectric layer 70 side and a second layer 82 opposite the piezoelectric layer 70 with respect to the first layer 81.

It is desirable that the first layer 81 be made of a material that allows the first layer 81 to form an interface with the piezoelectric layer 70 in a proper way and provides the first layer 81 with insulating and piezoelectric properties. Examples of suitable materials include noble metals such as iridium (Ir), platinum (Pt), palladium (Pd), and gold (Au), and conductive oxides such as lanthanum nickel oxide (LNO). The first layer 81 may be composed of two or more layers made of different materials. This embodiment uses a laminated electrode composed of iridium and titanium (iridium on the piezoelectric layer 70 side). Various methods can be used to form the first layer 81, including PVD (physical vapor deposition) techniques (gas-phase processes) such as sputtering and laser abrasion, and also liquid-phase techniques such as the sol-gel process, MOD (metal-organic decomposition), and plating. After the first layer 81 is formed, post-annealing can be performed to improve the characteristics of the piezoelectric layer 70. Such a first layer 81 is formed only on the piezoelectric layer 70, or more specifically only on the surface of the piezoelectric layer 70 opposite the flow channel substrate 10.

The second layer 82, another component of the second electrode 80, can be made of conductive materials including metallic materials such as iridium (Ir), platinum (Pt), palladium (Pd), and gold (Au). The second layer 82 may be made of one of such metallic materials or a mixture of two or more. It is also possible that a layer of titanium or a similar material is interposed between the first layer 81 and the second layer 82. The second layer 82 in this embodiment is made of iridium (Ir).

In this embodiment such a second layer 82 continuously extends over the first layer 81, the sides of the piezoelectric layer 70 (not covered by the first layer 81), and the first electrode 60. The second layer 82 on the first layer 81 is electrically separated from the second layer 82 on the first electrode 60 by a cut-out portion 83; the second layer 82 on the first layer 81 and the second layer 82 on the first electrode 60 are formed from the same layer but are electrically discontinuous. The cut-out portion 83 is created through the entire thickness of the first layer 81 and the second layer 82 (i.e., in the direction in which the first layer 81 and the second layer 82 are stacked) to electrically break the second electrode 80 on the nozzle opening 21 side of the piezoelectric layer 70. Such a cut-out portion 83 continuously extends in first direction X, cutting the second electrode 80 through its entire thickness.

Having such a first electrode 60, a piezoelectric layer 70, and a second electrode 80, each piezoelectric element 300 is displaced when voltage is applied between the first electrode 60 and the second electrode 80. In other words, applying voltage between these two electrodes induces piezoelectric strain on the piezoelectric layer 70 in the section where this layer is sandwiched between the first electrode 60 and the second electrode 80. The active section 310 is the section of the piezoelectric layer 70 in which this layer undergoes piezoelectric strain when voltage is applied between the two electrodes, whereas the inactive section is the section where the piezoelectric layer 70 does not. The active section 310, in which the piezoelectric layer 70 undergoes piezoelectric strain, is flexible in the portion facing the pressure chamber 12 and inflexible in the portion extending outside the edge of the pressure chamber 12.

In this embodiment, the first electrode 60, the piezoelectric layer 70, and the second electrode 80 all continuously extend beyond the edge of the pressure chamber 12 in second direction Y. The active section 310 therefore also continuously extends beyond the edge of the pressure chamber 12. The active section 310 is therefore flexible in the portion where the piezoelectric element 300 faces the pressure chamber 12, and is inflexible in the portion extending outside the edge of the pressure chamber 12.

In other words, the ends of the active section 310 in second direction Y are defined by the second electrode 80 (or more specifically by the cut-out portion 83) in this embodiment, as illustrated in FIGS. 3A and 3B.

On the other hand, the ends of the active section 310 in first direction X are defined by the first electrode 60, and the ends of the first electrode 60 in first direction X are within the area facing the pressure chamber 12. The active section 310 is therefore flexible at its ends in first direction X, and the stress that occurs at the boundary between the active section 310 and the inactive section in first direction X is released when the diaphragm is deformed. Thus, it is unlikely that stress concentrates at the ends of the active section 310 in first direction X and causes burnouts, cracks, or other sorts of damage to occur at these points.

In such a piezoelectric element 300, in which the second electrode 80 covers the piezoelectric layer 70, no current leakage occurs between the first electrode 60 and the second electrode 80; damage to the piezoelectric layer 300 is limited. If the first electrode 60 and the second electrode 80 were exposed and close to each other, leakage current would flow on the surface of the piezoelectric layer and break the piezoelectric layer 70. Even when the first electrode 60 and the second electrode 80 are exposed, putting one separately from the other avoids any current leakage.

An insulating film 200 is provided on the second electrode 80. The insulating film 200 can be made of any material that has insulating properties. Examples of materials that can be used include inorganic insulators such as titanium oxides (TiO$_x$), silicon oxides (SiO$_x$), tantalum oxides (TaO$_x$), and aluminum oxides (AlO$_x$), and organic insulators such as polyimides (PIs).

The insulating film 200 in this embodiment has substantially the same shape as the second layer 82 of the second electrode 80 in a plan view. The insulating film 200 therefore covers the portion of the first electrode 60 extending beyond the edge of the piezoelectric layer 70 and the second electrode 80 on the piezoelectric layer 70. The insulating film 200 in this embodiment is not for the purpose of preventing current from flowing between the first electrode 60 and the second electrode 80 (surface creepage); this film covers these electrodes (hereinafter also referred to as the main electrodes) while the adhesion layer 191 of a lead electrode 90 is patterned by etching in the manufacturing process (described in detail hereinafter). The insulating film 200 may therefore be removed except between the lead electrode 90 (wiring layer) and the main electrodes (the second layer 82 of the second electrode 80 in this embodiment); it is possible that in the finished device this film exists only between the main electrodes and the lead electrode 90.

The first electrode 60 and the second electrode 80 of such a piezoelectric element 300 are coupled to a separate lead electrode 91 and a common lead electrode 92 that form a wiring layer in this embodiment.

The separate lead electrode 91 and the common lead electrode 92 (hereinafter collectively referred to as the lead electrode 90) in this embodiment are made from the same layer but are electrically discontinuous. More specifically, the lead electrode 90 has an adhesion layer 191 on the main electrode (the second layer 82 of the second electrode 80) side and a conductive layer 192 on the adhesion layer 191.

The adhesion layer 191 allows the conductive layer 192 to be firmly attached to layers such as the second layer 82, the insulating film 200, and the diaphragm 50. Examples of materials that can be used to make this layer include nickel (Ni), chromium (Cr), nickel-chromium (NiCr), titanium (Ti), and titanium-tungsten (TiW). The adhesion layer 191 may be made of one of such materials or a mixture of two or more and may even be composed of two or more layers made of different materials. The adhesion layer 191 in this embodiment is a layer of nickel-chromium (NiCr).

The conductive layer 192 may be made of any material that shows relatively high conductivity. Examples of materials that can be used include gold (Au), platinum (Pt), aluminum (Al), and copper (Cu). The conductive layer 192 in this embodiment is made of gold (Au).

The separate lead electrode 91 is formed on the portion of the first electrode 60 extending outside the edge of the piezoelectric layer 70 and is electrically coupled to the first electrode 60 via a first contact hole 201 created through the entire thickness of the insulating film 200. As mentioned above, this portion of the first electrode 60 is covered with an electrode layer that is made from the same layer as the second layer 82 of the second electrode 80 but is electrically separated from the second layer 82. This electrode layer, which is made from the same layer as the second layer 82 but is discontinuous with the second layer 82, electrically couples the first electrode 60 and the separate lead electrode 91.

The common lead electrode 92 is formed on the second electrode 80 (the portion of the second electrode 80 extending on the piezoelectric layer 70) and is electrically coupled to the second electrode 80 via two second contact holes 202 created through the entire thickness of the insulating film 200. At both ends of the flow channel substrate 10 in first direction X, the common lead electrode 92 continuously extends in second direction Y to reach the diaphragm 50.

The common lead electrode 92 has elongated portions 93 that extend in second direction Y above the walls of the pressure chamber 12, i.e., across the boundaries between the flexible and inflexible portions. Each elongated portion 93 continuously extends over several active sections 310 in first direction X and is continuous with the common lead electrode 92 at both ends in first direction X. The common lead electrode 92 and its elongated portions 93 are continuous all around the periphery of the active sections 310 when viewed from the protective substrate 30 side. Forming such elongated portions 93 helps to limit the damage to the piezoelectric layer 70 caused by the stress concentrating at the boundaries between the flexible and inflexible portions and also ensures a sufficient amount of displacement of the active sections 310 because the top of their flexible portion is kept substantially clear of the common lead electrode 92.

Such a lead electrode 90 is formed by depositing a raw material layer on the entire surface of one side of the flow channel substrate 10 and then patterning it by wet etching (described in detail hereinafter).

The adhesion layer 191 in this embodiment is a layer of nickel-chromium (NiCr). Thus, the adhesion layer 191 is etched with cerium ammonium nitrate or a similar acidic etchant. During the etching process, the insulating film 200 protects the main electrodes (the first electrode and the second electrode 80) and limits the electrochemical corrosion that occurs between the adhesion layer 191 and the main electrodes. As a result, the lead electrode 90 is unlikely to detach. Etching the adhesion layer 191 with the main electrodes (the first electrode 60 and the second electrode 80) exposed could cause the acid to penetrate between the adhesion layer 191 and the main electrodes and lead to an electrochemical corrosion that would cause the lead electrode 90 to detach.

Such a problem, i.e., electrochemical corrosion between the adhesion layer 191 and the main electrodes, is also encountered with materials for the adhesion layer 191 other than nickel-chromium (NiCr), such as nickel (Ni), chromium (Cr), titanium (Ti), and titanium-tungsten (TiW), because even for such materials the etchant is still an acid and because materials suitable for electrodes generally have only a weak tendency to ionize. Forming an insulating film 200 as in this embodiment helps to prevent the lead electrode 90 from detaching even in such cases.

After such piezoelectric elements 300 are formed, a protective substrate 30 for protecting the piezoelectric elements 300 is bonded to the flow channel substrate 10 by using an adhesive agent 35 as illustrated in FIGS. 1 and 2. The protective substrate 30 has a piezoelectric element housing 31, which is a recess that defines the space to accommodate the piezoelectric elements 300. The protective substrate 30 also has a manifold portion 32 as a component of the manifold 100. The manifold portion 32 is formed through the entire thickness of the protective substrate 30 and along the direction of the width of the pressure chambers 12 and, as mentioned above, communicates with the communicating space 15 of the flow channel substrate 10. The protective substrate 30 also has a through-hole 33 formed through the entire thickness of the protective substrate 30. For each active section 310, the lead electrode 90 coupled to the first electrode 60 is exposed in the through-hole 33, and either end of wiring that leads to a driver is coupled to the lead electrode 90 in the through-hole 33 (not illustrated).

A compliance substrate 40 that has a sealing film and a stationary plate 42 is bonded to the protective substrate 30. The sealing film 41 is made of a low-rigidity flexible material, and the manifold portion 32 is sealed with the sealing film 41 on either side. The stationary plate 42 is made of a hard material such as metal. The stationary plate 42 has an opening 43 formed through its entire thickness over the area facing the manifold 100. One side of the manifold 100 is therefore sealed with the flexible sealing film 41 only.

In such a configuration the ink jet recording head I according to this embodiment receives ink from an external ink source (not illustrated) via an ink inlet, fills the entire space from the manifold 100 to the nozzle openings 21 with the ink, and then, in response to recording signals transmitted from a driver, distributes voltage between the pieces of the first electrode 60 for the individual pressure chambers 12 and the second electrode 80. This makes the piezoelectric elements 300 and the diaphragm 50 undergo flexural deformation. As a result, the pressure chambers 12 are pressurized and eject ink droplets through the nozzle openings 21.

The following describes a method for manufacturing such an ink jet recording head according to this embodiment. FIGS. 5A and 5B, 6A to 6C, 7A to 7D, 8A to 8D, and 9A to 9C are cross-sectional diagrams illustrating this method for manufacturing an ink jet recording head.

Figure 5A:
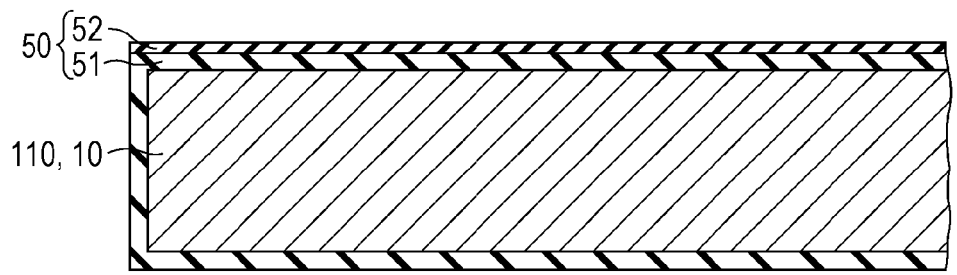
FIGS. 5A and 5B are cross-sectional diagrams illustrating a method for manufacturing a recording head according to Embodiment 1 of the invention.

First, an elastic film 51 is formed on the surface of a flow channel substrate wafer 110 (a silicon wafer) as illustrated in FIG. 5A. In this embodiment, the flow channel substrate wafer 110 is thermally oxidized to form a silicon dioxide coating (the elastic film 51), and then a layer of zirconium oxide is deposited on it by sputtering and thermally oxidized (an insulating film 52) to complete a diaphragm 50.

The diaphragm 50 (for a laminated diaphragm, the layer on the electrode side) should be made of an insulating material that withstands the temperature at which the piezoelectric layer 70 is to be formed (usually 500° C. or more). When it is planned to use a silicon wafer as the base for flow channel substrates 10 and anisotropically etch it with a KOH (potassium hydroxide) solution to create the pressure chambers 12 and other flow channel components therein, the diaphragm 50 (for a laminated diaphragm, the layer on the silicon wafer side) is also required to serve as an etch stop layer. Furthermore, when the diaphragm 50 contains silicon dioxide, the constituents of the piezoelectric layer 70, such as lead and bismuth, diffuse into the silicon dioxide portion and alter the characteristics of this portion, making the electrodes on it and the piezoelectric layer 70 more likely to detach. In such a case, therefore, a diffusion barrier layer is needed to protect the silicon dioxide portion.

A stack of a layer of silicon dioxide and a layer of zirconium oxide is the most preferred structure of the diaphragm 50 because both materials withstand the temperature at which the piezoelectric layer 70 is formed and because the silicon dioxide layer serves as both an insulating layer and an etch stop layer while the zirconium oxide layer serves as both an insulating layer and a diffusion barrier layer. Although this embodiment uses this structure, i.e., the elastic film 51 and the insulating film forming the diaphragm 50, it is also possible to form only either the elastic film 51 or the insulating film 52 and use it as the diaphragm 50.

Figure 5B:
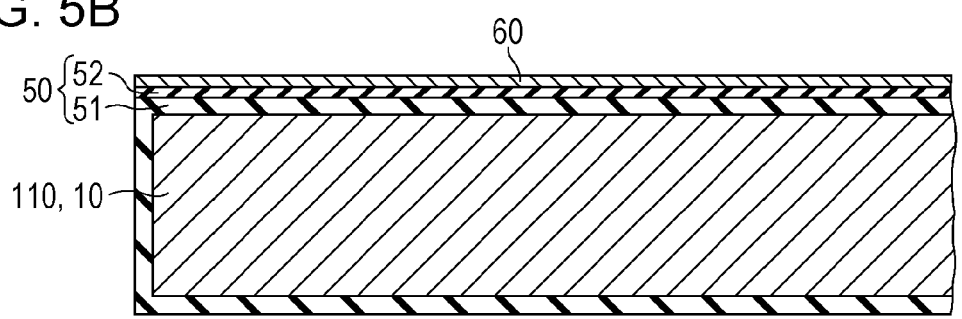

The entire surface of the insulating film 52 is then coated with a first electrode 60 as illustrated in FIG. 5B. The first electrode 60 can be made of any material that maintains conductivity after events such as the thermal oxidation (usually at a temperature of 500° C. or more) for forming the piezoelectric layer 70 and contamination by the constituents of the piezoelectric layer 70. Examples of suitable materials for the first electrode 60 therefore include metals such as platinum and iridium and conductive oxides such as iridium oxide and lanthanum nickel oxide, including a stack of layers made of such materials, because such materials maintain conductivity even at high temperatures. Examples of methods that can be used to form the first electrode 60 include sputtering and PVD (physical vapor deposition), gas-phase film formation techniques such as laser abrasion, and liquid-phase film formation techniques such as spin coating. An adhesion layer may be used to firmly attach the layer of conductive material to the diaphragm 50. Although not illustrated, this embodiment uses an adhesion layer made of titanium. Other examples of materials that can be used to make such an adhesion layer include zirconium, titanium, and titanium oxide. Examples of methods that can be used to form such an adhesion layer are similar to those for the electrode. It is also possible to form an orientation control layer on the surface of the electrode (on the piezoelectric layer 70 side) to control the growth of the crystals that form the piezoelectric layer 70. In this embodiment, a layer of titanium is used to control the growth of the crystals that form the piezoelectric layer 70 (PZT). The titanium in such a layer is incorporated into the piezoelectric layer 70 while the piezoelectric layer 70 is formed, and leaves no residual film after the piezoelectric layer 70 is completed. Such an orientation control layer can also be made of perovskite-structured conductive oxides such as lanthanum nickel oxide. Examples of methods that can be used to form such an orientation control layer are similar to those for the electrode. It is desirable that after the piezoelectric layer 70 is completed, no residual insulating orientation control film exist between the piezoelectric layer 70 and the first electrode 60; such an insulating residue forms a series connection of capacitors with the piezoelectric layer 70, reducing the strength of the electric field applied to the piezoelectric layer 70. This embodiment uses an orientation control layer made of titanium, which is incorporated into the piezoelectric layer 70, rather than being oxidized (turning into an insulating material), while being heated and leaves no residual film.

The next process in this embodiment is to form a layer of lead zirconate titanate (PZT) as the piezoelectric layer 70. The piezoelectric layer 70 in this embodiment is obtained as a metal oxide film by the sol-gel process, in which a metal complex is dissolved or dispersed in a solvent to form sol, the sol is applied and the obtained coating is dried into gel, and the gel is fired at a high temperature to form the piezoelectric layer 70. Methods other than the sol-gel process can also be used to make the piezoelectric layer 70, including MOD (metal-organic decomposition), and also PVD (physical vapor deposition) techniques such as sputtering and laser abrasion; both liquid-phase techniques and gas-phase techniques can be used to form the piezoelectric layer 70. The piezoelectric layer 70 in this embodiment is prepared by stacking several piezoelectric films 74 as described below.

Figure 6A:
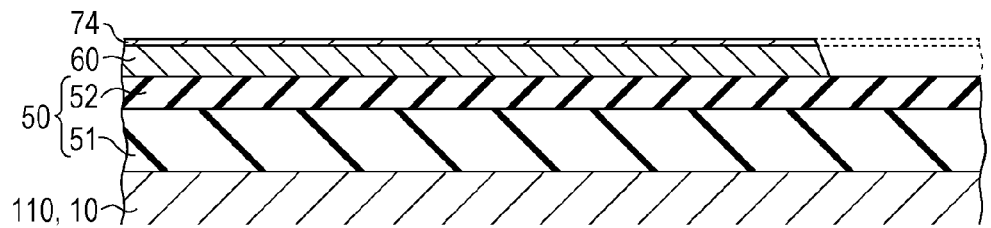
FIGS. 6A to 6C are cross-sectional diagrams illustrating a method for manufacturing a recording head according to Embodiment 1 of the invention.

As illustrated in FIG. 6A, a first piezoelectric film 74 is formed on the first electrode 60, and the first electrode 60 and the first piezoelectric film 74 are simultaneously patterned to have sloping sides. Examples of methods that can be used to pattern the first electrode 60 and the first piezoelectric film 74 include dry etching processes such as reactive ion etching (RIE) and ion milling.

Patterning the first electrode 60 before forming the first piezoelectric film 74, for example, would affect the characteristics of the surface of the first electrode 60 and other components on it, such as a seed crystal layer made of titanium or a similar material (not illustrated), because the process of patterning the first electrode 60 would involve photographic operations, ion milling, and ashing. Forming the piezoelectric film 74 on such an altered surface would result in insufficient crystallinity of the piezoelectric film 74. The poor crystallinity of the first piezoelectric film 74 would affect the crystals growing to form the second and subsequent piezoelectric films 74. As a result, the entire piezoelectric layer 70 would have insufficient crystallinity.

However, the approach of forming the first piezoelectric film 74 first and then patterning it simultaneously with the first electrode 60 affects the crystals growing to form the second and subsequent piezoelectric films 74 to a limited extent even if the patterning process forms an extremely thin altered layer on the top surface. This is because the first piezoelectric film 74 also provides the seed for crystals to grow well into the second and subsequent piezoelectric films 74, compared to seed crystals made of titanium or a similar material.

When the second and subsequent piezoelectric films are formed, it is possible to put an (intermediate) orientation control layer on the exposed surface of the diaphragm 50 (the exposed surface of the zirconium oxide insulating film 52 in this embodiment) before forming the second piezoelectric film 74. This embodiment uses an intermediate orientation control layer made of titanium. As with the titanium in the orientation control layer on the first electrode 60, this intermediate orientation control layer, made of titanium, is incorporated into the piezoelectric film 74 while the piezoelectric film 74 is formed. Any residue from such an intermediate orientation control layer results in reduced piezoelectric properties when it unfortunately acts as an intermediate electrode or a dielectric material in a series connection of capacitors. It is therefore desirable that such an intermediate orientation control layer be completely incorporated into the piezoelectric film 74 (piezoelectric layer 70) and leave no residual film after the piezoelectric layer 70 is completed.

Figure 6B:
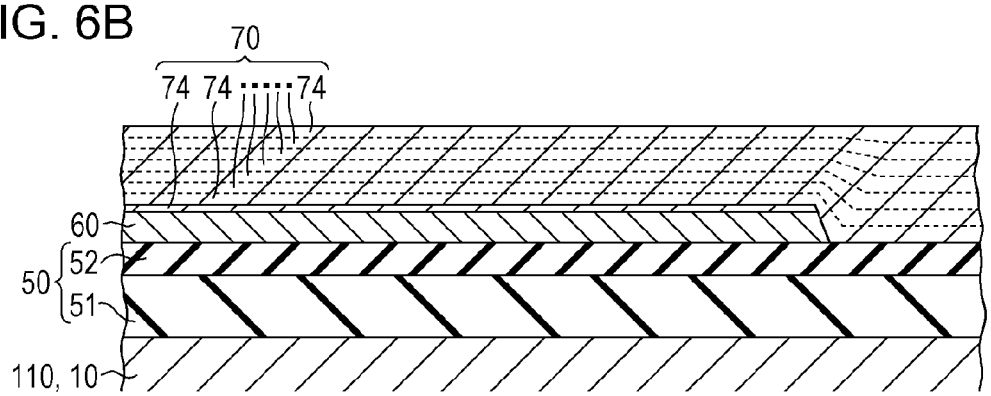

The second and subsequent piezoelectric films 74 are then stacked as illustrated in FIG. 6B. In this way, the piezoelectric layer 70 is formed from several piezoelectric films 74.

The second and subsequent piezoelectric films 74 continuously extend over the insulating film 52, the sides of the first electrode 60 and the first piezoelectric film 74, and the top of the first piezoelectric film 74.

Figure 6C:
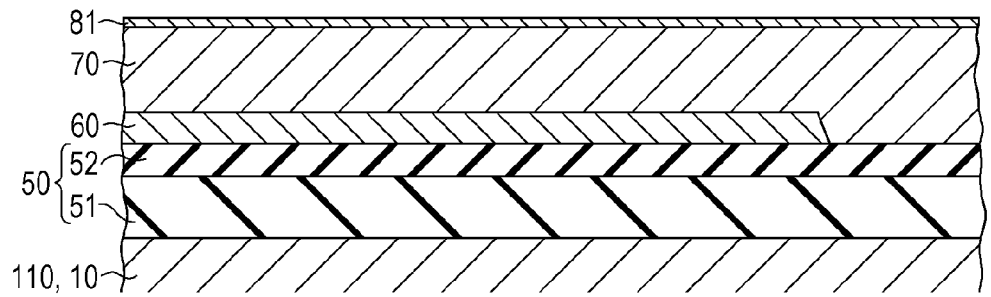

A first layer 81 is then formed on the piezoelectric layer 70 as illustrated in FIG. 6C. In this embodiment, an iridium layer that contains iridium is first deposited on the piezoelectric layer 70, and then a titanium layer that contains titanium is deposited on the iridium layer (both not illustrated). The iridium layer and the titanium layer can be formed by sputtering or CVD, for example. The piezoelectric layer 70 is then heated once again, with the iridium layer and the titanium layer thereon (post-annealing). Although forming layers such as the iridium layer on the second electrode 80 side of the piezoelectric layer 70 can cause damage, such a post-annealing process repairs the damage to the piezoelectric layer 70 and improves the piezoelectric properties of the piezoelectric layer 70.

Figure 7A:
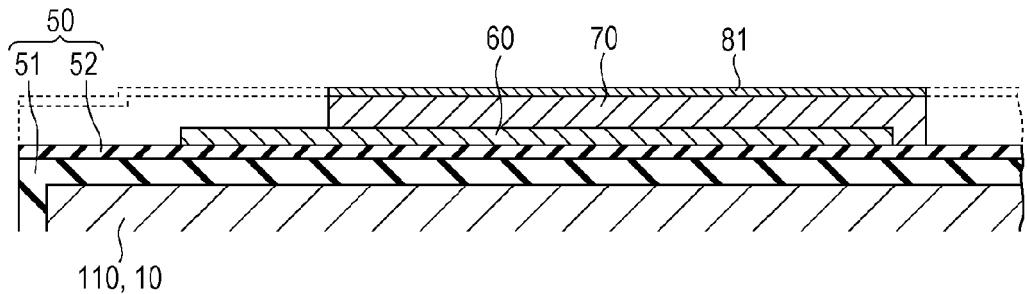
FIGS. 7A to 7D are cross-sectional diagrams illustrating a method for manufacturing a recording head according to Embodiment 1 of the invention.

The first layer 81 and the piezoelectric layer 70 are then patterned after pressure chambers 12 as illustrated in FIG. 7A. In this embodiment these layers are patterned by photolithography, or more specifically by placing a patterned mask (not illustrated) on the first layer 81 and etching the first layer 81 and the piezoelectric layer 70 through the mask. Examples of methods that can be used to pattern the piezoelectric layer 70 include dry etching processes such as reactive ion etching and ion milling.

Figure 7B:
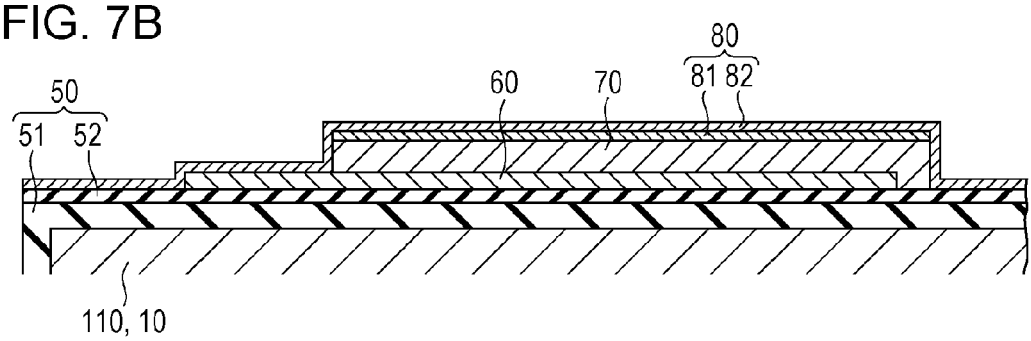

A layer of iridium (Ir) or a similar material is then deposited to form a second layer 82 on one side of the flow channel substrate wafer 110 (on the piezoelectric layer 70 side), or more specifically over several areas including the top of the first layer 81, the sides of the patterned piezoelectric layer 70, the top of the insulating film 52, and the top of the first electrode 60, as illustrated in FIG. 7B, to complete a second electrode 80.

An insulating film 200 is then formed. Examples of materials that can be used to make the insulating film 200 include inorganic insulators such as titanium oxides ($TiO_x$), silicon oxides ($SiO_x$), tantalum oxides ($TaO_x$), and aluminum oxides ($AlO_x$), and organic insulators such as polyimides (PIs). Examples of methods that can be used to form the insulating film 200 include liquid-phase techniques such as spin coating, gas-phase techniques such as sputtering and CVD, and combinations of such techniques and thermal oxidation.

Figure 7C:
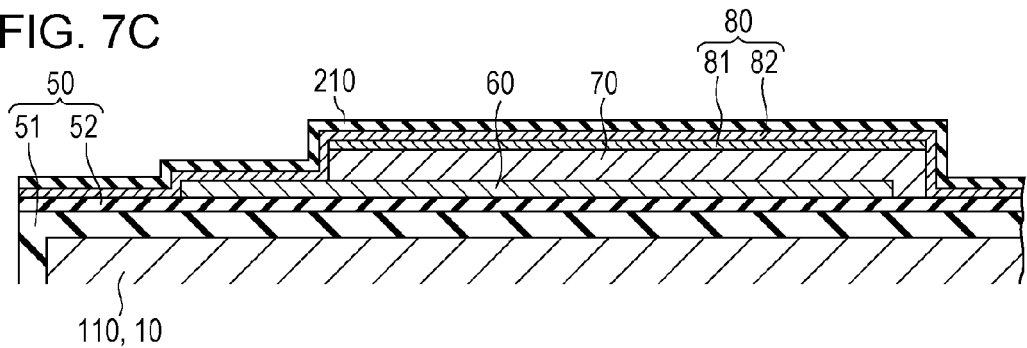
Figure 7D:
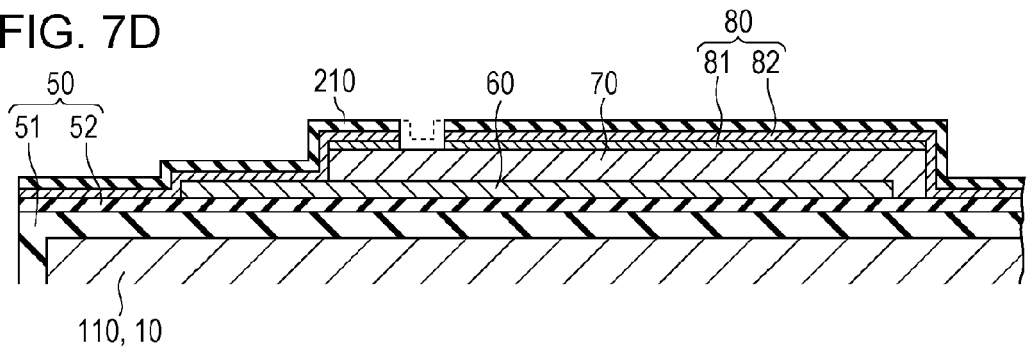

In this embodiment, a layer of titanium (Ti) is first deposited to form a titanium layer 210 on one side of the flow channel substrate wafer 110 as illustrated in FIG. 7C, and then the second electrode 80 (the first layer 81 and the second layer 82) and the titanium layer 210 are patterned as illustrated in FIG. 7D. More specifically, a patterned resist or a different kind of a patterned mask (not illustrated) is placed on the titanium layer 210, the titanium layer 210 is dry-etched through the mask, and the mask is removed by ashing. The resist mask through which the second electrode 80 and the titanium layer 210 are dry-etched is removed by oxygen ($O_2$) plasma treatment. As a result, the titanium layer 210 is oxidized and forms a layer of titanium oxides ($TiO_x$), which is used as the insulating film 200.

Examples of methods that can be used to dry-etch the second electrode 80 and the titanium layer 210 include reactive ion etching and ion milling. The second electrode 80 and the titanium layer 210 (insulating film 200) can be simultaneously patterned by using such techniques.

In this way, the insulating film 200 can be formed by depositing a layer of an easily oxidizable material on the second electrode 80 and converting the material into oxides. In the above method, a layer of titanium (Ti) is deposited to form the titanium layer 210 and oxidized into a titanium oxide ($TiO_x$) film. However, titanium is not the only material that can be used; other oxidizable materials can also be used.

Furthermore, the above is not the only method to form the insulating film 200. It is also possible to form the insulating film 200 by depositing a layer of titanium oxide or a similar insulating material directly on the second electrode 80.

Simultaneously etching the second electrode 80 and the insulating film 200 in this way ensures that the insulating film 200 and the second layer 82 occupy the same area, i.e., these two components have the same shape and exactly fit each other in a plan view. The second layer 82 and the insulating film 200 are formed to extend over several areas including the top of the first layer 81, the portion of the first electrode 60 that is not covered with the piezoelectric layer 70, the sides of the piezoelectric layer 70, and the portions of the diaphragm 50 located under the depressions 71.

It is also possible that the second electrode 80 and the insulating film 200 are separately patterned by etching. However, patterning these components together simplifies the entire manufacturing process and reduces costs.

This process also includes making a hole in the second electrode 80 and the insulating film 200 on the piezoelectric layer 70 through the entire thickness and removing that portion to form a cut-out portion 83, which defines the edge of the second electrode 80 and, accordingly, the boundary between the active section 310 and the inactive section.

Figure 8A:
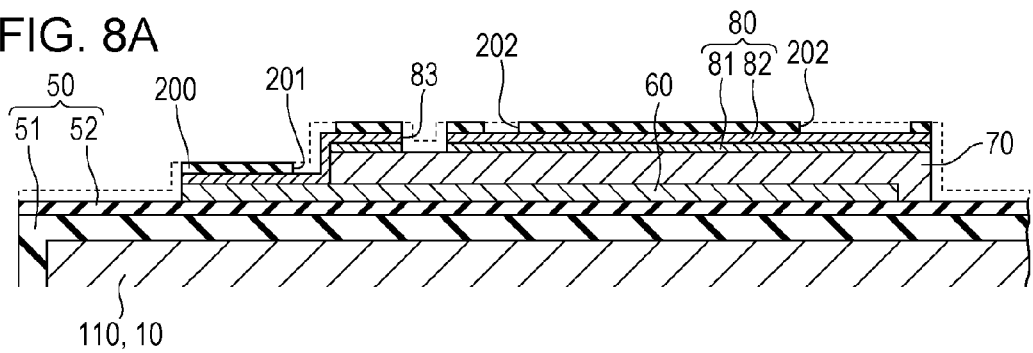
FIGS. 8A to 8D are cross-sectional diagrams illustrating a method for manufacturing a recording head according to Embodiment 1 of the invention.

The insulating film 200 is then etched so that several features such as a first contact hole 201 and second contact holes 202 are formed as illustrated in FIG. 8A. In this embodiment, the first contact hole 201, the second contact holes 202, and some other features are created by dry-etching the insulating film 200.

Figure 8B:
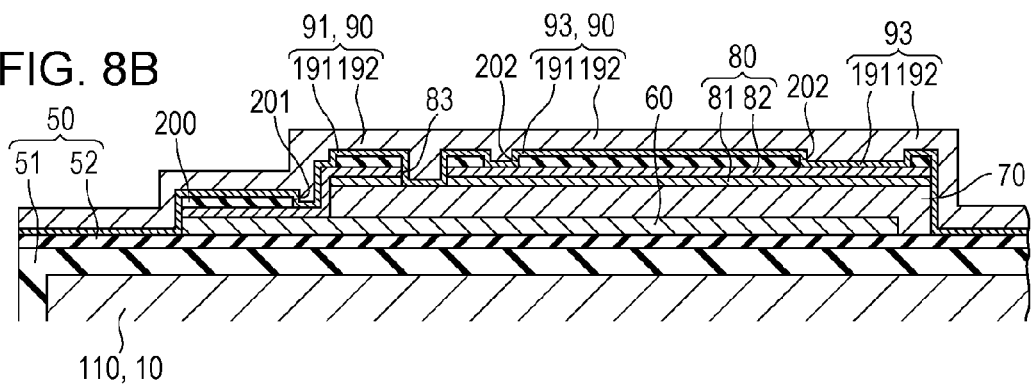

A lead electrode 90 (a wiring layer) is then formed as illustrated in FIG. 8B. This layer is formed by depositing a layer of nickel-chromium (NiCr) as an adhesion layer 191 on the entire surface of one side of the flow channel substrate wafer 110 and then depositing a layer of gold (Au) as a conductive layer 192. As a result, the first electrode 60 (the second layer 82) and the second electrode 80 are electrically coupled to the lead electrode 90 via the first contact hole 201 and the second contact holes 202, respectively, created through the insulating film 200.

Figure 8C:
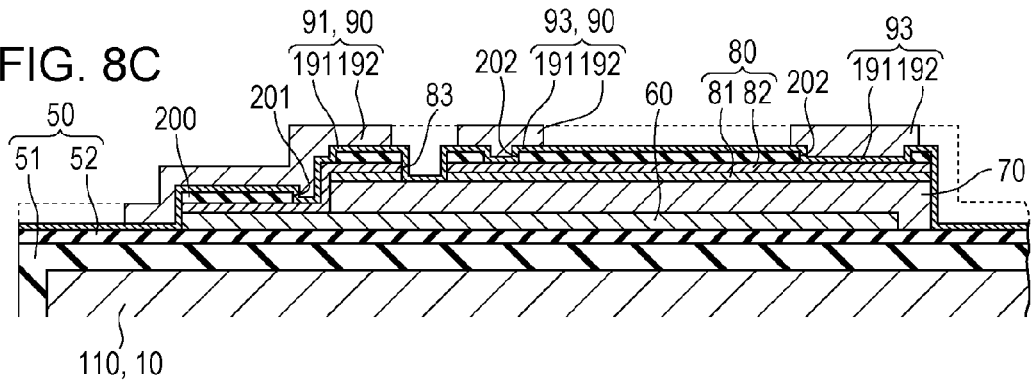

The conductive layer 192 is then patterned by wet etching as illustrated in FIG. 8C. More specifically, a patterned mask (not illustrated) is placed on the conductive layer 192, and the conductive layer 192 is etched through the mask.

Figure 8D:
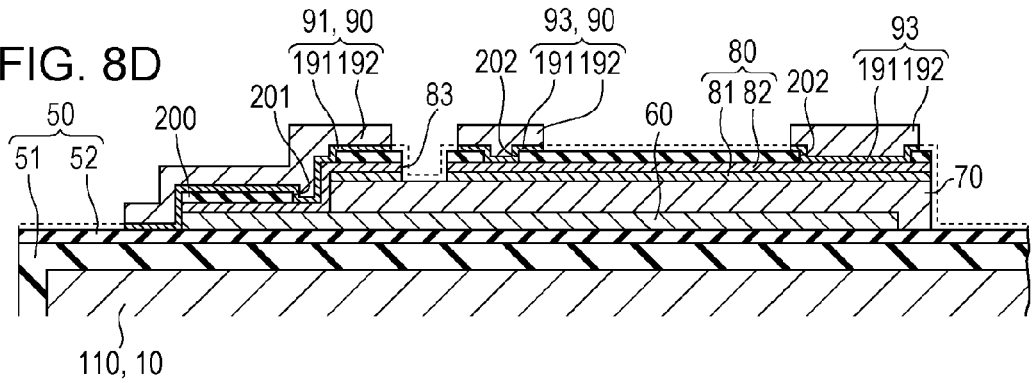

The adhesion layer 191 is then patterned by wet etching using an acid as illustrated in FIG. 8D. The conductive layer 192 is used as a mask, through which the adhesion layer 191 is wet-etched, forming separate lead electrodes 91 and a common lead electrode 92.

Although the adhesion layer 191 is etched using an acid as etchant, the insulating film 200 protects the main electrodes (the second layer 82) and limits the electrochemical corrosion that occurs between the adhesion layer 191 and the main electrodes (the second layer 82). Wet-etching the adhesion layer 191 with the main electrodes (the first electrode 60 and the second electrode 80) exposed would cause the acidic etchant to penetrate between the adhesion layer 191 and the main electrodes and induce electrochemical corrosion. In this embodiment, the main electrodes are covered with the insulating film 200 and are not exposed; it is unlikely that electrochemical corrosion occurs between the adhesion layer 191 and the main electrodes even when an acid is used as etchant. Limiting the electrochemical corrosion between the adhesion layer 191 and the main electrodes (the second layer 82 on the first electrode 60, and the second electrode 80) helps to prevent the lead electrode 90 from detaching because of electrochemical corrosion.

Figure 9A:
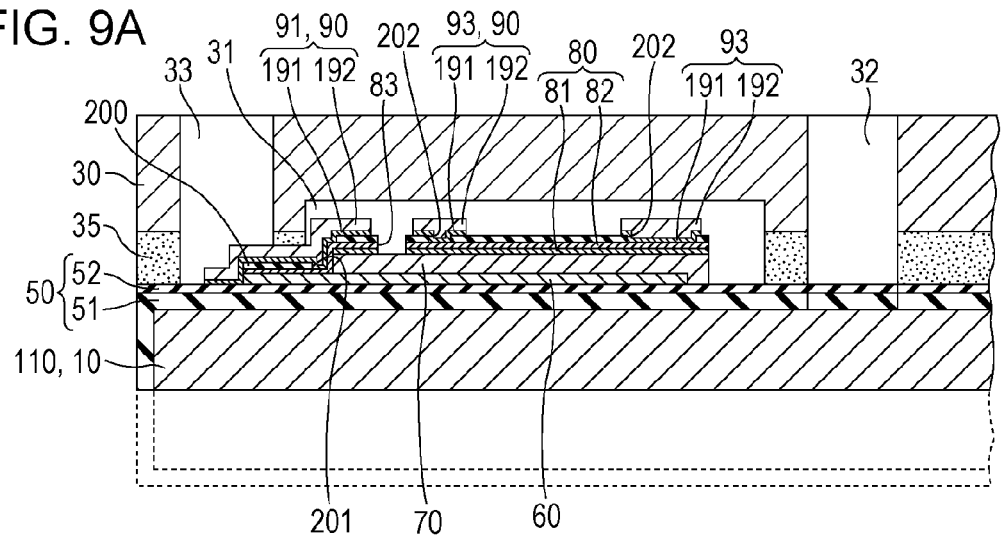
FIGS. 9A to 9C are cross-sectional diagrams illustrating a method for manufacturing a recording head according to Embodiment 1 of the invention.

As illustrated in FIG. 9A, a protective substrate wafer 130 (a silicon wafer) as the base for several protective substrates 30 is then bonded using an adhesive agent 35 to the piezoelectric element 300 side of the flow channel substrate wafer 110, and the flow channel substrate wafer 110 is reduced in thickness.

Figure 9B:
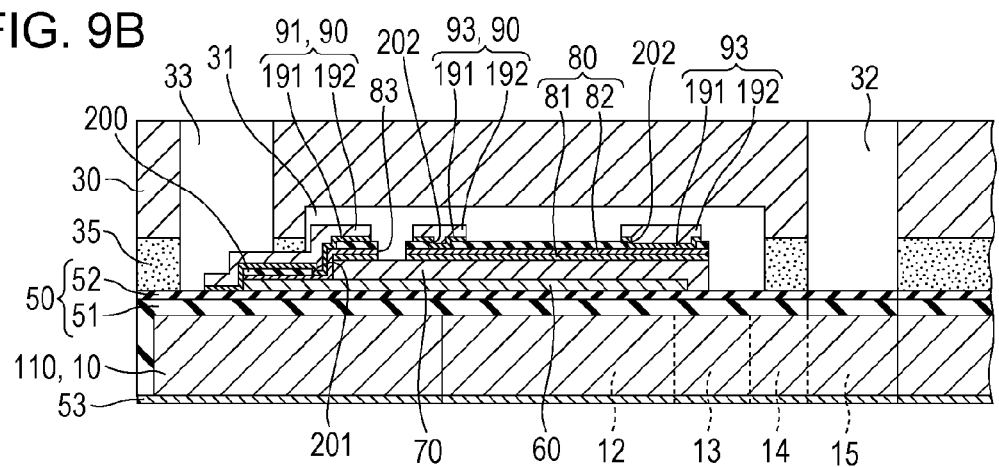
Figure 9C:
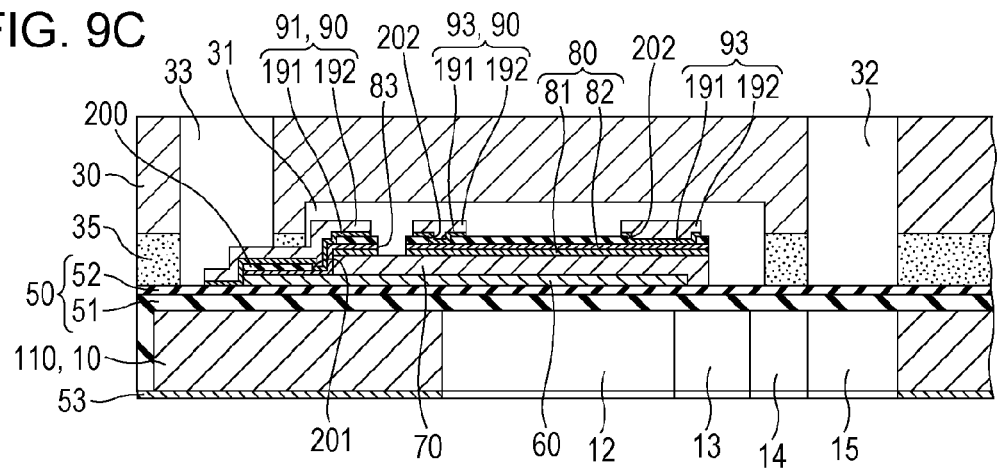

A mask coating 53 is then formed and patterned on the flow channel substrate wafer 110 as illustrated in FIG. 9B. The flow channel substrate wafer 110 is then anisotropically etched with an alkali such as a KOH solution (wet etching) through the mask coating 53 as illustrated in FIG. 9C. This process forms the pressure chambers 12 for the individual piezoelectric elements 300 along with ink supply paths 13, communicating paths 14, a communicating space 15, and other features.

The flow channel substrate wafer 110 and the protective substrate wafer 130 are then trimmed by cutting off their unnecessary edge by dicing or a similar technique. A nozzle plate 20 drilled with nozzle openings 21 is then bonded to the surface of the flow channel substrate wafer 110 opposite the protective substrate wafer 130, and compliance substrates 40 are bonded to the protective substrate wafer 130. The entire structure including the flow channel substrate wafer 110 and all other components bonded thereto is divided into equal-sized chips each composed of one flow channel substrate 10 and other components like that illustrated in FIG. 1. In this way, ink jet recording heads according to this embodiment are obtained.

In this way, forming the insulating film 200, or forming an insulating film at least between the lead electrode 90 as a wiring layer (the separate lead electrodes 91 and the common lead electrode 92) and the main electrodes (the second layer 82 on the first electrode 60, and the second electrode 80), limits the electrochemical corrosion that occurs between the adhesion layer 191 of the lead electrode 90 and the main electrodes while the adhesion layer 191 is wet-etched, making the lead electrode 90 less likely to detach. The lead electrode 90 can also be patterned by dry etching rather than wet etching, and admittedly no electrochemical corrosion could occur between the adhesion layer 191 and the main electrodes with dry etching. However, dry etching could cause over-etching of several components including the first electrode 60, the second electrode 80, and the diaphragm 50, which would affect the displacement and electric properties of the finished devices. Furthermore, batch processing is possible with wet etching and impossible with dry etching; dry etching is more costly than wet etching. Forming the lead electrode 90 by wet etching therefore has two advantages: it limits the over-etching of the first electrode 60, the second electrode 80, the diaphragm 50, and other components that affects the displacement properties of the finished devices and damages their electric properties (by causing wire breaks and/or increasing their electric resistance), and it also reduces costs.

Note that the insulating film 200 in this embodiment is not for the purpose of preventing current from flowing between the first electrode 60 and the second electrode 80 of the piezoelectric elements 300, but for limiting the electrochemical corrosion between the adhesion layer 191 and these electrodes (the main electrodes) that occurs with the use of an acidic etchant while the adhesion layer 191 is patterned by wet etching. The insulating film 200 may therefore be removed after the adhesion layer 191 is wet-etched, except between the lead electrode 90 and the main electrodes. Known piezoelectric elements that have a first electrode as a common electrode shared by more than one device and a second electrode exclusive to each device require a protective film that prevents current from flowing between the first electrode 60 and the second electrode 80 where the first electrode 60 and the second electrode 80 are exposed and close to each other. The insulating film 200 in this embodiment is for the purpose of protecting the main electrodes (the second layer 82 on the first electrode 60, and the second electrode 80) while the adhesion layer 191 is wet-etched; the insulating film 200 can be removed in a later process without causing any problems, except between the lead electrode 90 and the main electrodes. More importantly, devices according to this embodiment, unlike known piezoelectric elements, require no protective film against current leakage because the second electrode 80 serves as a common electrode for several active sections 310 and this structure allows the first electrode 60 and the second electrode 80 to be completely covered with the second layer 82 with a sufficient distance therebetween. Furthermore, removing the insulating film 200 except between the lead electrode 90 and the main electrodes means that the top of the active sections 310 is clear of the insulating film 200, which is advantageous in that the residual insulating film 200 interferes with the movement of the active sections 310 only to a limited extend and, as a result, great displacement is achieved.

Embodiment 2

Figure 10A:
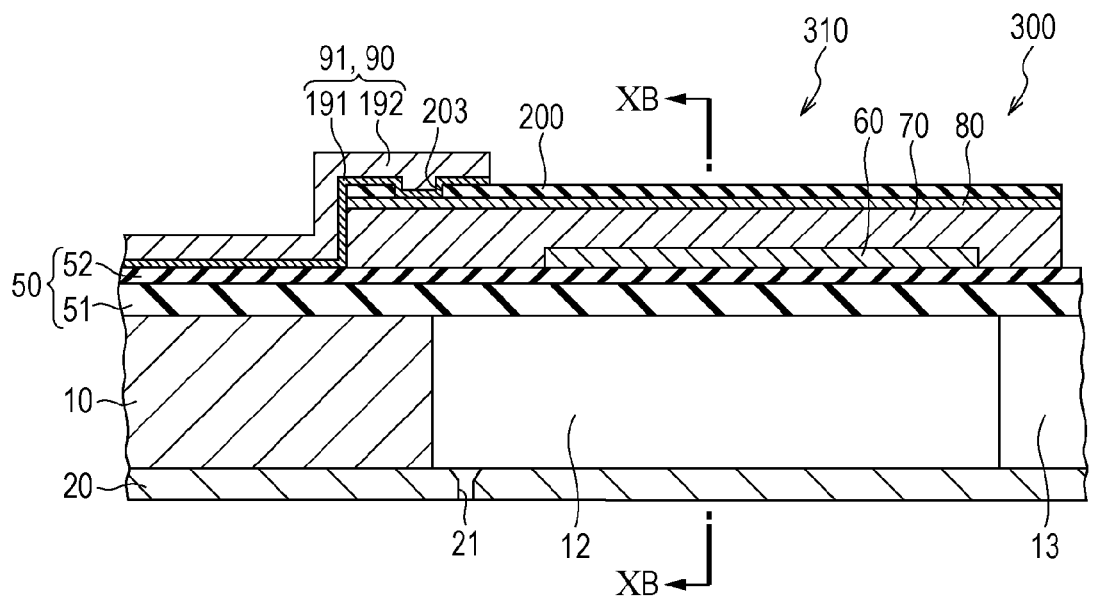
FIGS. 10A and 10B are enlarged cross-sectional views of some essential components of a recording head according to Embodiment 2 of the invention.
Figure 10B:
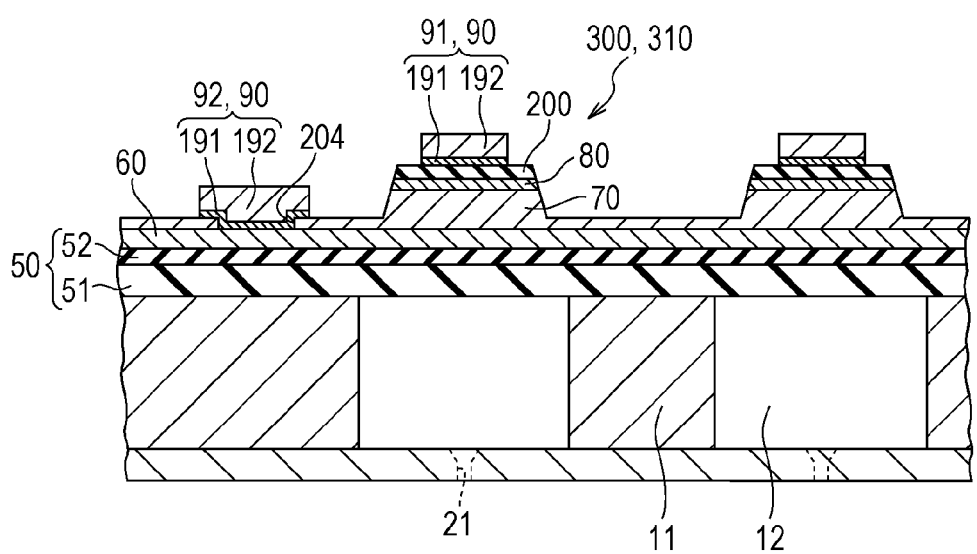

FIG. 10A is an enlarged cross-sectional view of some essential components of an ink jet recording head as an example of a liquid ejecting head according to Embodiment 2 of the invention, and FIG. 10B is a cross-sectional view of the same recording head taken along line XB-XB. Features similar to those described in Embodiment 1 are represented by the same reference numerals as in that embodiment and are not described in the following.

As illustrated in these drawings, an ink jet recording head I according to this embodiment has piezoelectric elements 300 in which the first electrode 60 extends over several active sections 310 and serves as a common electrode for them, while the second electrode 80 provides separate electrodes for the active sections 310.

More specifically, the first electrode 60 is narrower than the width of the pressure chamber 12 in second direction Y and continuously extends in first direction X.

The piezoelectric layer 70 extends beyond the edge of the first electrode 60, covering the ends of the first electrode 60 in second direction Y.

In first direction X, the piezoelectric layer 70 continuously extends from each active section 310 to the next and is thinner than the active sections 310 in such regions. This means that the first electrode 60 is completely covered with the piezoelectric layer 70 in the region between each active section 310 and the next in first direction X.

The second electrode 80 is cut into pieces for the individual pressure chambers 12.

In such piezoelectric elements 300, the ends of the active section 310 in second direction Y are defined by the edge of the first electrode 60, and the ends of the active section 310 in first direction X are defined by the edge of each piece of the second electrode 80 (hereinafter simply referred to as the second electrode 80).

Each of such piezoelectric elements 300 further has an insulating film 200. In this embodiment, the insulating film 200 is formed on the second electrode 80.

Separate lead electrodes 91 are formed on the insulating film 200. Each separate lead electrode 91 is electrically coupled to the second electrode 80 via a third contact hole 203 created through the entire thickness of the insulating film 200.

At both ends in first direction X, a common lead electrode 92 is formed on the piezoelectric layer 70. The common lead electrode 92 is electrically coupled to the first electrode 60 via fourth contact holes 204 created through the entire thickness of the piezoelectric layer 70.

Such a configuration, in which the first electrode is not exposed, requires no protective film for the piezoelectric elements 300, unlike any known configuration.

The insulating film 200 protects the second electrode 80 and limits the electrochemical corrosion that occurs between the lead electrode 90 (the separate lead electrodes 91 and the common lead electrode 92) and the second electrode 80 while the lead electrode 90 is wet-etched using an acidic etchant, making the lead electrode 90 less likely to detach.

The following describes a method for manufacturing an ink jet recording head I according to this embodiment with reference to FIGS. 11A to 11D and 12A to 12D. Processes similar to those described in Embodiment 1 are not described in the following.

Figure 11A:
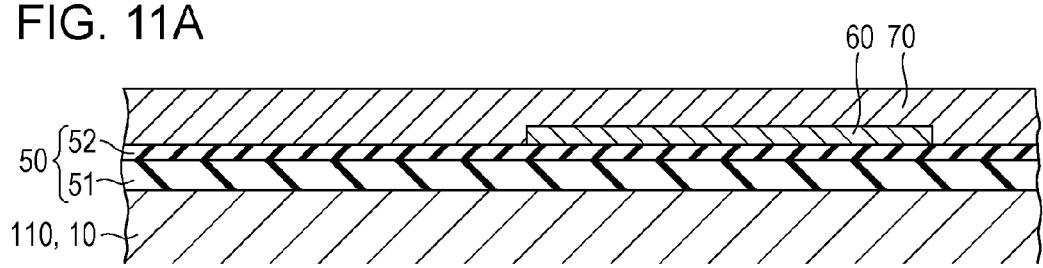
FIGS. 11A to 11D are cross-sectional diagrams illustrating a method for manufacturing a recording head according to Embodiment 2 of the invention.

As illustrated in FIG. 11A, a diaphragm 50, a first electrode 60, and a piezoelectric layer 70 are formed on a flow channel substrate wafer 110 by a method similar to that in Embodiment 1.

Figure 11B:
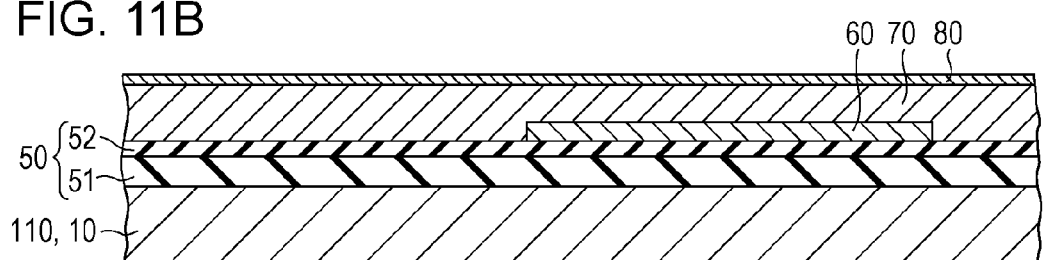

A second electrode 80 is then formed on the piezoelectric layer 70 as illustrated in FIG. 11B.

Figure 11C:
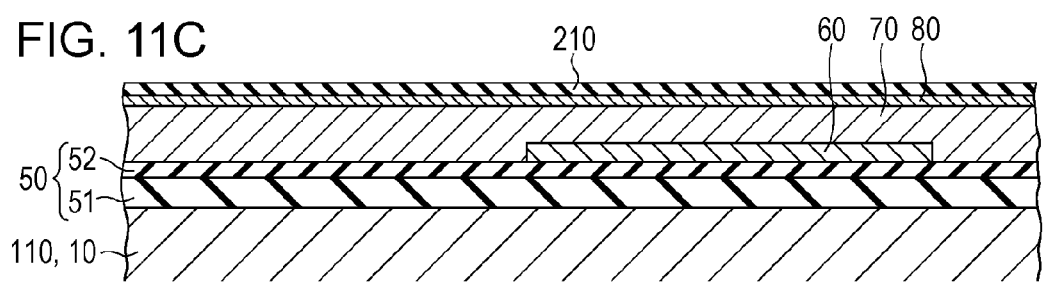

A layer of titanium (Ti) is then deposited to form a titanium layer 210 on the second electrode 80 as illustrated in FIG. 11C.

Figure 11D:
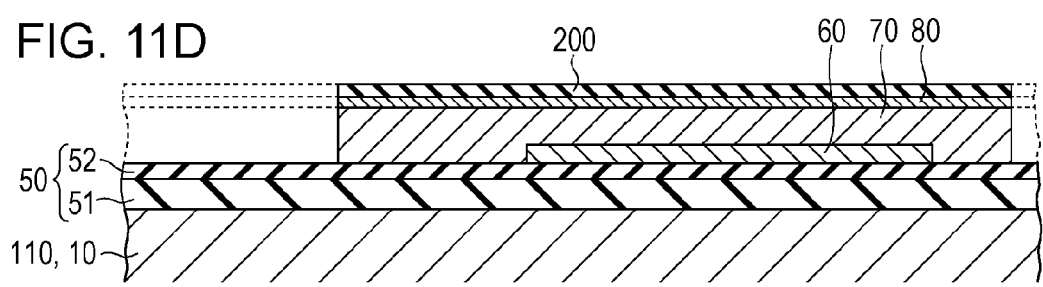

The titanium layer 210, the second electrode 80, and the piezoelectric layer 70 are then patterned as illustrated in FIG. 11D. The titanium layer 210, the second electrode 80, and the piezoelectric layer 70 can be patterned simultaneously by dry etching and can also be patterned separately by wet etching or a similar technique.

In this embodiment, a patterned resist or a different kind of a patterned mask is first placed on the titanium layer 210, and then the titanium layer 210, the second electrode 80, and the piezoelectric layer 70 are simultaneously patterned by dry-etching the titanium layer 210, the second electrode 80, and the piezoelectric layer 70. Then the mask is removed in such a way that the titanium layer 210 is oxidized and forms a layer of titanium oxides ($TiO_x$), which is used as the insulating film 200.

As in Embodiment 1, other materials can also be used to make the insulating film 200. It is also possible to form the insulating film 200 directly on the second electrode 80 without using the titanium layer 210.

Figure 12A:
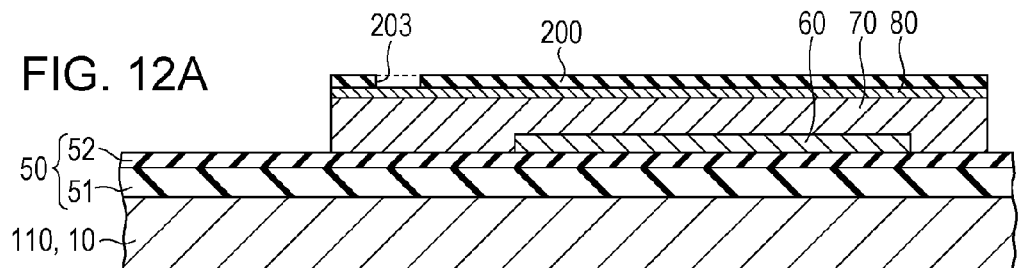
FIGS. 12A to 12D are cross-sectional diagrams illustrating a method for manufacturing a recording head according to Embodiment 2 of the invention.

Third contact holes 203 are then created in the insulating film 200 as illustrated in FIG. 12A, and fourth contact holes 204 (not illustrated) are created in the piezoelectric layer 70. More specifically, a patterned mask is placed on the insulating film 200 and the piezoelectric layer 70, and the insulating film 200 and the piezoelectric layer 70 are etched through the mask.

Figure 12B:
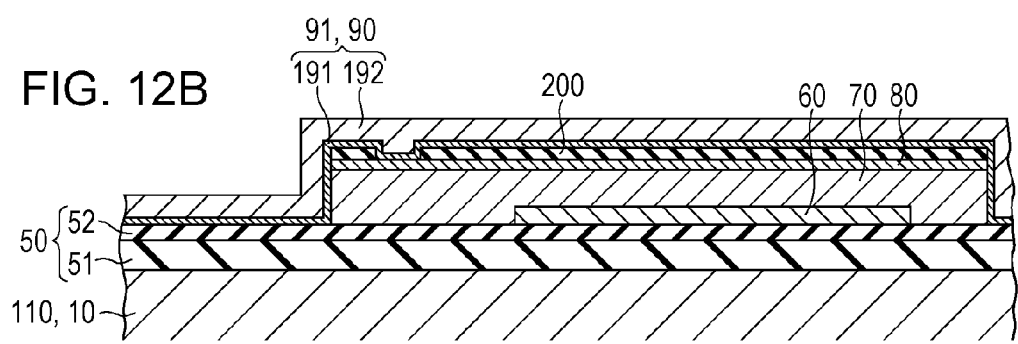

An adhesion layer 191 and a conductive layer 192 are then deposited on one side of the flow channel substrate wafer 110 to form a lead electrode 90 (a wiring layer) as illustrated in FIG. 12B.

Figure 12C:
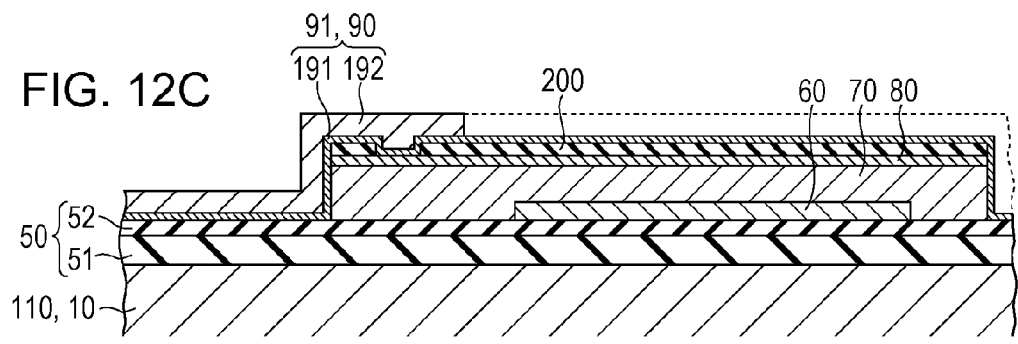

The conductive layer 192 is then patterned by wet etching as illustrated in FIG. 12C. More specifically, a patterned mask (not illustrated) is placed on the conductive layer 192, and the conductive layer 192 is etched through the mask.

Figure 12D:
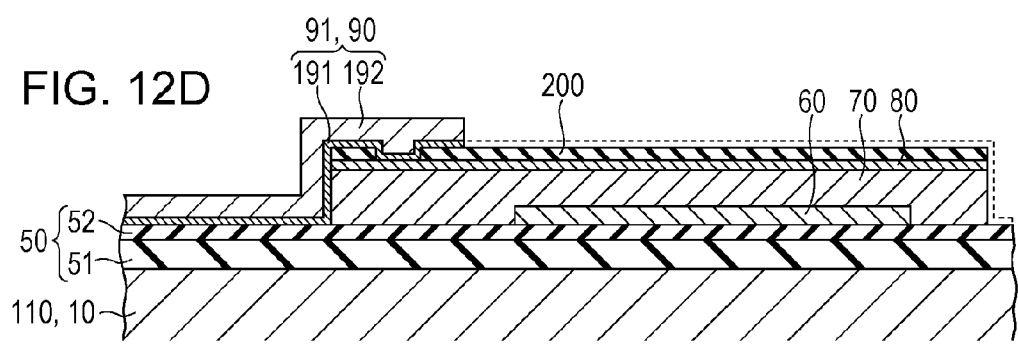

The adhesion layer 191 is then patterned by wet etching using an acid as illustrated in FIG. 12D. The conductive layer 192 is used as a mask, through which the adhesion layer 191 is wet-etched, forming separate lead electrodes 91 and a common lead electrode 92.

Although the adhesion layer 191 is etched using an acid as etchant, the insulating film 200 protects the main electrodes (the second electrode 80) and limits the electrochemical corrosion that occurs between the adhesion layer 191 and the main electrodes. Wet-etching the adhesion layer 191 with the main electrodes (the first electrode 60 and the second electrode 80) exposed would cause the acidic etchant to penetrate between the adhesion layer 191 and the main electrodes and induce electrochemical corrosion. In this embodiment, the main electrodes, in particular, the second electrode 80, are covered with the insulating film 200 and are not exposed; it is unlikely that electrochemical corrosion occurs between the adhesion layer 191 and the main electrodes even when an acid is used as etchant. Limiting the electrochemical corrosion between the adhesion layer 191 and the main electrodes (the second electrode 80) helps to prevent the lead electrode 90 from detaching.

Then, by a method similar to that in Embodiment 1, a protective substrate wafer 130 as the base for protective substrates 30 is bonded, pressure chambers 12 and related features are created in the flow channel substrate wafer 110, and other components such as a nozzle plate 20 and compliance substrates 40 are bonded. The entire structure is then divided into equal-sized chips each composed of one flow channel substrate 10 and other components. In this way, ink jet recording heads I according to this embodiment are obtained.

Although in this embodiment the insulating film 200 extends over the entire second electrode 80, this is not its only possible shape. For example, the insulating film 200 may be removed except under the lead electrode 90.

This embodiment, in which the first electrode 60 serves as a common electrode for several active sections 310, allows, for example, the elastic film 51 and the insulating film 52 to be omitted and the first electrode 60 itself to work as a diaphragm. It is also possible that each piezoelectric element 300 substantially serves as a diaphragm, regardless of whether the first electrode 60 provides separate electrodes as in Embodiment 1 or the first electrode 60 serves as a common electrode. When the first electrode 60 is formed directly on the flow channel substrate 10, however, it is preferred to protect the first electrode 60 with an insulating protective film or a similar material to prevent electricity from flowing from the first electrode 60 to the ink. When it is herein stated that the first electrode 60 is formed on the substrate (flow channel substrate 10), therefore, it means that the electrode can be in direct contact with the substrate or with any other component therebeneath (i.e., the electrode can be above the substrate).

Other Embodiments

The foregoing describes some embodiments of an aspect of the invention, and each embodiment is not the only possible basic structure of that aspect of the invention.

For example, although in Embodiment 1 the active sections 310 share a continuous piezoelectric layer 70, it is possible to divide the piezoelectric layer 70 into several pieces for the individual active sections 310.

Furthermore, although in Embodiment 1 the second electrode 80 is a stack of a first layer 81 and a second layer 82, this is not the only possible structure of this electrode; the second electrode 80 may be a single layer or a stack of three or more layers. The second electrode 80 in Embodiment 2 may also have two or more layers.

Figure 13:
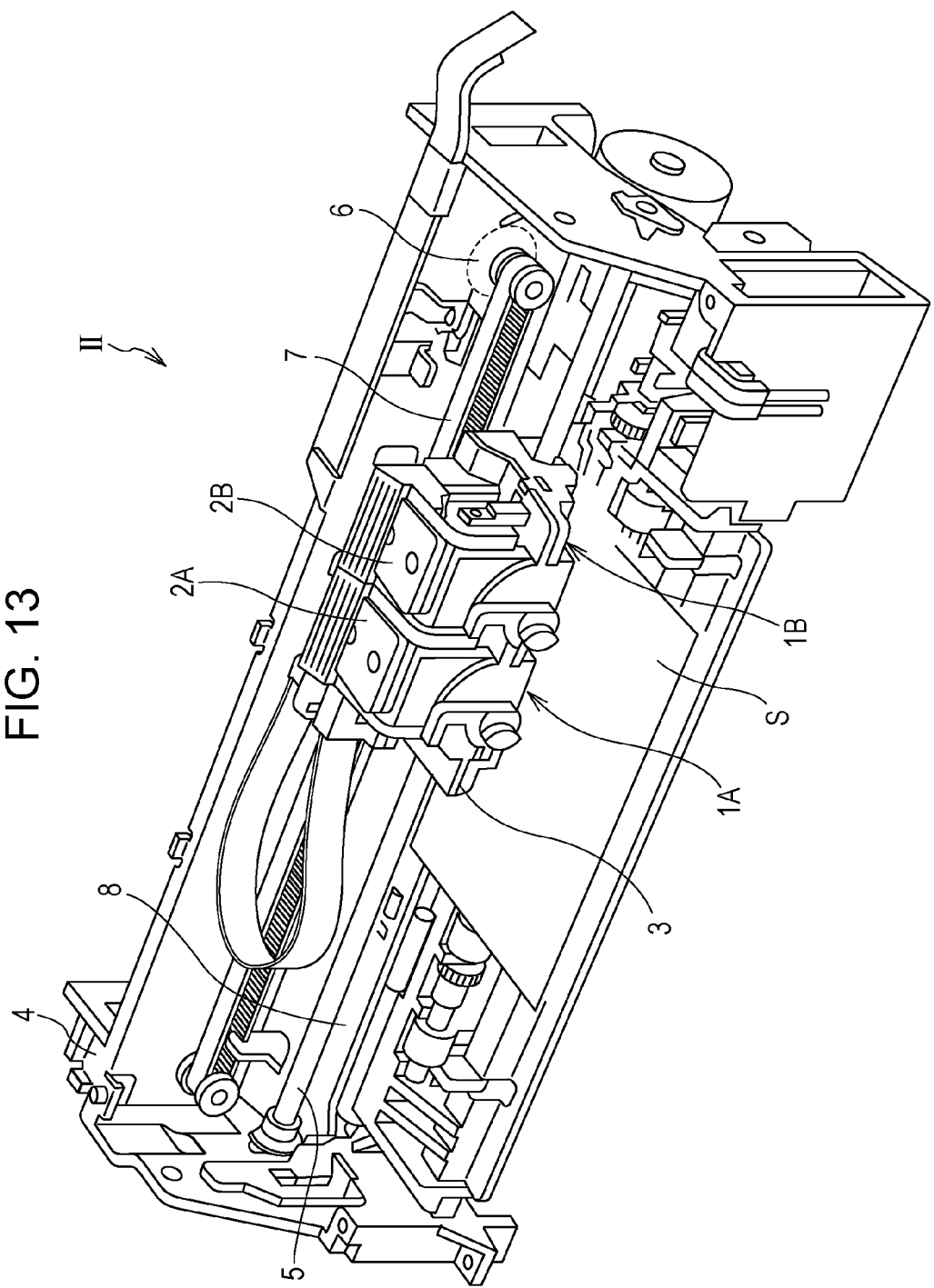
FIG. 13 is a schematic view of a liquid ejecting apparatus according to an embodiment of the invention.

As illustrated in FIG. 13, the ink jet recording head I can be installed in an ink jet recording apparatus II, for example. The recording head units 1A and 1B hold ink jet recording heads I and are equipped with detachable ink supply cartridges 2A and 2B. The carriage 3 for the recording head units 1A and 1B can move along a carriage shaft 5 installed in the main body 4. The recording head units 1A and 1B eject a black ink composition and a color ink composition, for example.

Driving force generated by a motor 6 is transmitted through gears (not illustrated) and a timing belt 7 to the carriage 3. As a result, the carriage 3 and the recording head units 1A and 1B supported thereby move along the carriage shaft 5. The main body 4 also has a platen 8 that extends along the carriage shaft 5; a feeder such as a set of rollers (not illustrated) feeds a recording sheet S (a recording medium such as paper), which is then transported by the platen 8.

An aspect of the invention limits, as described above, damage to the piezoelectric elements 300 used in the ink jet recording heads I and ensures uniform ejection properties, thereby improving the print quality and the durability of the ink jet recording apparatus II.

Although in the illustrated ink jet recording apparatus II the ink jet recording heads I move on the carriage 3 in the primary scanning direction, this is not the only possible configuration. For example, the ink jet recording apparatus II can be a line-head recording apparatus, in which the ink jet recording heads I remain in fixed positions and the recording sheet S (a recording medium such as paper) moves in the secondary scanning direction.

The ink jet recording heads described in the above embodiments are examples of liquid ejecting heads according to an aspect of the invention, and this aspect of the invention can also be applied to other liquid ejecting heads, such as recording heads for printers and other kinds of image recording apparatus, colorant ejecting heads for manufacturing color filters for liquid crystal displays and other kinds of displays, electrode material ejecting heads for forming electrodes for organic EL displays, FEDs (field emission displays), and other kinds of displays, and bioorganic substance ejecting heads for manufacturing biochips.

Furthermore, some aspects of the invention may be applied not only to piezoelectric elements for ink jet recording heads and other liquid ejecting heads, but also those for sonars and other ultrasonic devices, ultrasonic motors, and sensors such as pressure sensors and pyroelectric sensors. Some aspects of the invention may be applied to ferroelectric elements such as ferroelectric memories.

The entire disclosure of Japanese Patent Application No. 2012-277758, filed Dec. 20, 2012 is incorporated by reference herein.

What is claimed is:

1. A liquid ejecting head comprising:
   a flow channel substrate, the flow channel substrate having a pressure chamber communicating with a nozzle opening for ejecting liquid; and
   a piezoelectric element, the piezoelectric element provided to the flow channel substrate and having a piezoelectric layer, a pair of electrodes, and a wiring layer coupled to the electrodes, the wiring layer having an adhesion layer and a conductive layer on the adhesion layer, the adhesion layer containing at least one selected from nickel, chromium, titanium, and tungsten, wherein:
   the piezoelectric element has an insulating film at least between the wiring layer and the electrodes;
   the wiring layer and each of the electrodes of the piezoelectric element are coupled via a contact hole created through the insulating film; and
   a cut-out portion is formed in each of the wiring layer, insulating film, and second electrode that exposes a surface of the piezoelectric layer.

2. The liquid ejecting head according to claim 1, wherein the pair of electrodes are a first electrode on a flow channel substrate side and a second electrode opposite the flow channel substrate with respect to the piezoelectric layer.

3. The liquid ejecting head according to claim 2, wherein:
   the second electrode has a first layer on a piezoelectric layer side and a second layer on a side opposite the first layer; and
   the insulating film and the second layer have been simultaneously patterned.

4. The liquid ejecting head according to claim 1, wherein the insulating film is made of titanium oxide.

5. A liquid ejecting apparatus comprising the liquid ejecting head according to claim 1.

6. A liquid ejecting apparatus comprising the liquid ejecting head according to claim 2.

7. A liquid ejecting apparatus comprising the liquid ejecting head according to claim 3.

8. A liquid ejecting apparatus comprising the liquid ejecting head according to claim 4.

9. A piezoelectric element comprising:
   a piezoelectric layer;
   a first electrode and a second electrode that sandwich the piezoelectric layer; and
   a wiring layer coupled to the first and second electrodes, the wiring layer having an adhesion layer and a conductive layer on the adhesion layer, the adhesion layer containing at least one selected from nickel, chromium, titanium, and tungsten, wherein:
   the piezoelectric element has an insulating film at least between the wiring layer and the first and second electrodes;
   the wiring layer and each of the electrodes are coupled via a contact hole created through the insulating film; and
   a cut-out portion is formed in each of the wiring layer, insulating film, and second electrode that exposes a surface of the piezoelectric layer.

* * * * *